(12) United States Patent
Gao et al.

(10) Patent No.: US 12,513,905 B2
(45) Date of Patent: Dec. 30, 2025

(54) THREE-DIMENSIONAL MEMORY DEVICE AND METHOD OF FORMING THE SAME

(71) Applicant: Yangtze Memory Technologies Co., Ltd., Hubei (CN)

(72) Inventors: Tingting Gao, Wuhan (CN); Zhiliang Xia, Wuhan (CN); Zongliang Huo, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 661 days.

(21) Appl. No.: 17/901,195

(22) Filed: Sep. 1, 2022

(65) Prior Publication Data
US 2024/0081069 A1    Mar. 7, 2024

(51) Int. Cl.
H10B 43/35    (2023.01)
H10B 43/27    (2023.01)

(52) U.S. Cl.
CPC ............ H10B 43/35 (2023.02); H10B 43/27 (2023.02)

(58) Field of Classification Search
CPC ........ H10B 43/35; H10B 43/27; H10B 41/27; H10B 41/35; H10B 43/00; H10B 69/00; H10B 12/488; H10B 12/485; H10B 12/482; H10B 20/40
See application file for complete search history.

(56) References Cited

U.S. PATENT DOCUMENTS

2020/0091071 A1*  3/2020  Lee ................... H01L 21/76816

* cited by examiner

Primary Examiner — Ajay Ojha
Assistant Examiner — Sandra Milena Rodriguez Villanu
(74) Attorney, Agent, or Firm — Oblon, McClelland, Maier & Neustadt, L.L.P.

(57) ABSTRACT

According to an aspect of the disclosure, a semiconductor device is provided. The semiconductor device includes a stack structure of alternating insulating layers and word line layers, a first top select gate (TSG) layer over the stack structure, and a separation structure extending through the first TSG layer, where the first TSG layer is divided by the separation structure into a first sub TSG layer and a second sub TSG layer. The semiconductor device includes a conductive layer positioned between the first sub TSG layer and the separation structure, and between the second sub TSG layer and the separation structure.

20 Claims, 25 Drawing Sheets

THREE-DIMENSIONAL MEMORY DEVICE AND METHOD OF FORMING THE SAME

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

According to an aspect of the disclosure, a semiconductor device is provided. The semiconductor device can include a stack structure of alternating insulating layers and word line layers, a first top select gate (TSG) layer over the stack structure, and a separation structure extending through the first TSG layer, where the first TSG layer can be divided by the separation structure into a first sub TSG layer and a second sub TSG layer. The semiconductor device can include a conductive layer positioned between the first sub TSG layer and the separation structure, and between the second sub TSG layer and the separation structure.

The semiconductor device can also include a first channel structure extending through the stack structure, and a second channel structure extending through the first TSG layer. The second channel structure can be positioned over and coupled to the first channel structure.

In some embodiments, the first channel structure can include a block layer extending through the insulating layers and the word line layers, and further into a substrate on which the stack structure is positioned. The first channel structure can include a charge storage layer formed over the blocking layer, a tunneling layer formed over the charge storage layer, a channel layer formed over the tunneling layer, an isolation layer formed over the channel layer, and a top channel contact formed over the isolation layer and in contact with channel layer.

In some embodiments, the second channel structure can include a gate dielectric layer extending through the first TSG layer, and a second channel layer formed along the gate dielectric layer. The second channel layer can be disposed over and in contact with the top channel contact of the first channel structure.

In some embodiments, the word line layers can include a first material, and the first TSG layer can include a second material that is different from the first material. In some embodiments, the conductive layer can include a metallic silicide.

The semiconductor device can include a second TSG layer positioned between the stack structure and the first TSG layer, and an interface layer positioned between the first TSG layer and the second TSG layer.

In some embodiments, the separation structure can further extend through the second TSG layer and the interface layer to divide the second TSG layer into a third sub TSG layer and a fourth sub TSG layer. Accordingly the conductive layer can further be positioned between the second TSG layer and the interface layer, between the interface layer and the first TSG layer, between the third sub TSG layer and the separation structure, and between the fourth sub TSG layer and the separation structure.

The semiconductor device can include a slit structure extending through the word line layers and the insulating layers and further extending along a direction parallel to the substrate. The semiconductor device can include a separation structure extending along the direction parallel to the substrate, extending through the first and second TSG layers, and positioned over the slit structure.

The semiconductor device can include an array region and a staircase region adjacent to the array region. The first channel structure and the second channel structure can be positioned in the array region, and the staircase region can includes a plurality of stairs formed in the stack structure and the first and second TSG layers.

In some embodiments, the plurality of stairs can include a first stair formed in the first and second TSG layers. Accordingly, the semiconductor device can include a TSG contact formed at the first stair of the plurality of stairs. The TSG contact can extend from the second TSG layer, the conducive layer that is positioned (i) between the second TSG layer and the interface layer and (ii) between the interface layer and the first TSG layer, and the interface layer.

In some embodiments, the conductive layer can further extend through the first TSG layer so as to surround the TSG contact, and extend into the second TSG layer such that the TSG contact is positioned on the conductive layer.

In some embodiments, the plurality of stairs can include a first stair formed in the first TSG layer and a second stair formed in the second TSG layer. Accordingly, the semiconductor device can include a first TSG contact extending from the interface layer, and through the conductive layer and first TSG layer at the first stair of the plurality of stairs, and a second TSG contact extending from the second TSG layer and through the interface layer at the second stair of the plurality of stairs.

In some embodiments, the conductive layer can further extend through the first TSG layer so as to surround the first TSG contact, and extend into the second TSG layer such that the second TSG contact is positioned on the conductive layer.

According to another aspect of the disclosure, a method of manufacturing a semiconductor device is provided. In the method, a stack structure can be formed to include alternating insulating layers and word line layers over a substrate. A first TSG layer can be formed over the stack structure, a separation structure can be formed to extend along a direction parallel to the substrate and through the first TSG layer such that the first TSG layer can be divided by the separation structure into a first sub TSG layer and a second sub TSG layer. A conductive layer can be formed between the first sub TSG layer and the separation structure, and between the second sub TSG layer and the separation structure.

In the method, a first channel structure can be formed to extend through the insulating layers and the word line layers and into the substrate. A second channel structure can be arranged over and coupled to the first channel structure. The second channel structure can further extend through the first TSG layer.

To form the first channel structure, a channel opening can be formed to extend through the insulating layers and the word line layers and further into the substrate. A blocking layer can be formed in the channel opening, a charge storage layer can be formed over the blocking layer, a tunneling layer can be formed over the charge storage layer, a channel layer can be formed over the tunneling layer, an isolation layer can be formed over the channel layer, and forming a top channel contact over the isolation layer and in contact with the channel layer.

In the method, to form the second channel structure, a gate dielectric layer can be formed to extend through the first TSG layer and into the top channel contact of the first channel structure. A second channel layer can be formed along the gate dielectric layer, where the second channel layer can be disposed over and in contact with the top channel contact of the first channel structure. A second isolation layer can be formed over the second channel layer, and a second channel contact can be formed over the second isolation layer and in contact with the second channel layer.

In the method, a first dielectric layer can be formed over the first TSG layer, a second dielectric layer can be formed over the first dielectric layer, and a contact can be formed over the second channel structure and extend through the second dielectric layer.

In some embodiments, a second TSG layer can be formed between the stack structure and the first TSG layer, and an interface layer can be formed between the first TSG layer and the second TSG layer.

In some embodiments, the separation structure can further extend through the second TSG layer and the interface layer to divide the second TSG layer into a third sub TSG layer and a fourth sub TSG layer. Accordingly, the conductive layer can further be positioned between the second TSG layer and the interface layer, between the interface layer and the first TSG layer, between the third sub TSG layer and the separation structure, and between the fourth sub TSG layer and the separation structure.

In the method, a slit structure can be formed to extend through the word line layers and the insulating layers and further extend along a direction parallel to the substrate. A separation structure can be formed to extend along the direction parallel to the substrate, extend through the first and second TSG layers, and be positioned over the slit structure.

According to yet another aspect of the disclosure, a memory system device can be provided. The memory system can include control circuitry coupled with a memory device. The memory device can include a stack structure that is formed of alternating insulating layers and word line layers. The memory device can further include a first TSG layer over the stack structure and a separation structure extending through the first TSG layer. The first TSG layer can be divided by the separation structure into a first sub TSG layer and a second sub TSG layer. The memory device can include a conductive layer positioned between the first sub TSG layer and the separation structure, and between the second sub TSG layer and the separation structure.

BRIEF DESCRIPTION OF THE DRAWINGS

Aspects of the present disclosure can be understood from the following detailed description when read with the accompanying figures, it is noted that, in accordance with the standard practice in the industry, various features are not drawn to scale. In fact, the dimensions of the various features may be increased or reduced for clarity of discussion.

DETAILED DESCRIPTION

Figure 1A:
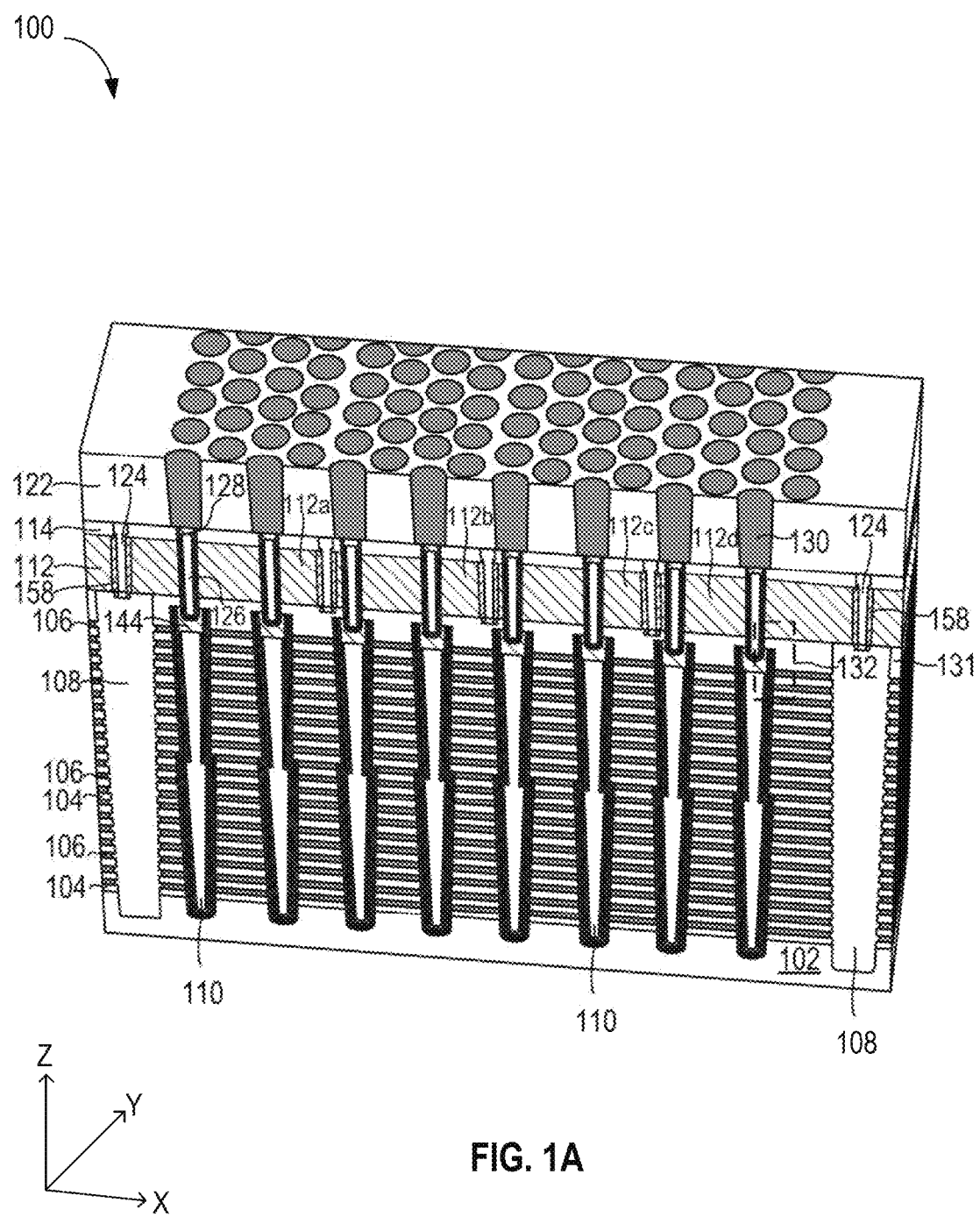
FIG. 1A is a perspective view of a first 3D NAND memory device, in accordance with exemplary embodiments of the disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some 3D NAND memory devices, a stack of alternating insulating layers and word line layers can be formed over a substrate, where one or more uppermost word line layers in the stack can function as top select gate (TSG) layers, and the word line layers can include tungsten. A plurality of channel structures can extend through the insulating layers and the word line layers to form a plurality of memory cell strings. Each of the memory cell strings can include a plurality of memory cells and one or more top select transistors (TSTs) that are connected in series and formed based on a respective channel structure and the word line layers. Further, a plurality of TSG cut structures (or separation structures) can be formed to separate the TSG layers into sub TSG layers. Accordingly, the related 3D NAND memory device can be divided into a plurality of sections that can be operated independently.

In the disclosure, in an embodiment, a 3D NAND device can include a stack structure of alternating insulating layers and word line layers over a substrate, a TSG layer over the stack structure, and a separation structure extending through the TSG layer, where the TSG layer can be divided by the separation structure into a first sub TSG layer and a second sub TSG layer. The 3D NAND device can also include a conductive layer positioned between the first sub TSG layer and the separation structure, and between the second sub TSG layer and the separation structure. A plurality of first channel structures can extend through the stack structure, and a plurality of second channel structure can be positioned over the first channel structures and further extend through the TSG layer.

In another embodiment of the disclosure, the 3D NAND device can include a stack of TSG layers and dielectric layers positioned alternatingly over the stack structure, where the TSG layers and the word line layers can include different materials. A plurality of first channel structure can extend through the stack structure and a plurality of second channel structures can be positioned on the first channel structures and extend through the TSG layers to form a plurality of TSTs. A plurality of TSG cut structures (or separation structures) can be formed to separate the TSG layers into sub TSG layers. Further, conductive layers, such as silicide layers, can be formed between the TSG layers and the dielectric layers, and between the sub TSG layers and the separation structures to form high conductivity channels for voltage transmission, which can effectively reduce a voltage drop and a signal delay of the TSG layers. In addition, contact structures at the staircase region of the 3D NAND device can also be connected to the conductive layers to reduce a contact potential between the contact structures and the TSG layers.

FIG. 1A is a perspective view of a 3D NAND memory device (or device) 100, in accordance with exemplary embodiments of the disclosure. As shown in FIG. 1A, the device 100 can include a stack of alternating insulating layers 104 and word line layers 106 positioned over a substrate 102. In some embodiments, the substrate 102 may be a semiconductor substrate such as a Si substrate. In some embodiments, the substrate 102 can be a sacrificial layer and be removed in future manufacturing steps. In some embodiments, the substrate 102 can be a semiconductor layer, such as a polysilicon layer. In order to form the polysilicon layer, a sacrificial substrate (not shown) can be provided firstly on which the insulating layers 104 and word line layers 106 are formed. The sacrificial substrate can be removed by an etching process, and a deposition process, such as an epitaxial deposition, can be applied to form the polysilicon layer. The insulating layers 104 and the word line layers 106 can extend in both a first direction (or X direction) parallel to the substrate 102 and a second direction (or Y direction) parallel to the substrate 102, where the first direction can be perpendicular to the second direction. The device 100 can include a plurality of first channel structures 110 extending through the insulating layers 104 and the word line layers 106 and into the substrate 102. The device 100 can include a top dielectric layer 131 over the stack of alternating insulating layers 104 and word line layers 106. The device 100 can further include a first top select gate (TSG) layer 112 positioned over the top dielectric layer 131, a first dielectric layer 114 over the first TSG layer 112, and a plurality of second channel structures 126. The second channel structures 126 can be positioned over and coupled to the first channel structure 110 and extend through the first TSG layer 112 and the first dielectric layer 114.

The device 100 can also include a plurality of slit structures 108. For example, two slit structures 108 are included in FIG. 1A. In some embodiments, a gate-last fabrication technology is used to form the device 100. Thus, an initial stack of alternating insulating layers (e.g., 104) and sacrificial layers (not shown) can be formed over the substrate 102. The slit structures 108 are subsequently formed to assist in the removal of the sacrificial word line layers, and the formation of the actual word line layers (e.g., 106). In some embodiments, the slit structures 108 can function as common sources and separation structures. Thus, each of the slit structures 108 can include a dielectric spacer (not shown) extend through the insulating layers 104 and the word line layers 106, and a conductive layer formed along the dielectric spacer. In some embodiments, the slit structures 108 can be dielectric structures to divide the device 100 into several regions.

The device 100 can further include a plurality of separation structures (or TSG cut structures) 124 that extends along the second direction (e.g., Y direction) parallel to the substrate 102, and further extends through the first TSG layer 112 such that the first TSG layer 112 can be divided by the separation structures 124. For example, the first TSG layer 112 can be divided into four sub TSG layers 112a-112d by the separation structures 124 in FIG. 1A. The device 100 can include a second dielectric layer 122 positioned over the first dielectric layer 114, and a plurality of contacts 130 extending from the second channel structures 126 and through the second dielectric layer 122. The contacts 130 can further be connected to backend of line (BEOL) metal layers (not shown) on which bias voltages can be applied to operate the second channel structures 126 and the first channel structures 110.

In the device 100, conductive layers 158 can be formed along sidewalls of the sub TSG layers (e.g., 112a-112d) such that the conductive layers 158 can be arranged between the separation structures 124 and the sub TSG layers (e.g., 112a-112d). In some embodiments, the conductive layer 158 can include a silicide material, such as TiSi, NiSi, WSi, or the like. In some embodiments, the conductive layer 158 can include any suitable conductive materials, such as metallic materials (e.g., Cu, Al, Co, Ti, Ni, Ta, Ru, and W), conductive composites (e.g., TaN or TiN), or the like. In the disclosure, the conductive layers 158 can form high conductivity channels for voltage transmission, which can effectively reduce the voltage drop and signal delay of the first TSG layer 112. In addition, the first dielectric layer 114 over the first TSG layer 112 can function as a process stop layer for a chemical mechanical planarization (CMP) process during the formation of the separation structures 124. The first dielectric layer 114 can also function as a landing stop layer for the contacts 130, which can effectively reduce the critical dimension (CD) mismatch between the contacts 130 and the second channel structures 126.

Still referring to FIG. 1A, a plurality of memory cell strings can be formed based on the first channel structures 110, the second channel structures 126, the word line layers 106, and the first TSG layer 112. Each of the memory cell strings can include memory cells that are formed based on the a respective first channel structure 110 and the word line layers 106, and a TST that is formed based on a respective second channel structure 126 and the first TSG layer 112. The memory cells and the TST are disposed sequentially and in series over the substrate 102 along a vertical direction (e.g., Z direction) perpendicular to the substrate 102.

The separation structures (or TSG cut structures) 124 can divide the first TSG layer 112 into a plurality of sub TSG layers. For example, four sub TSG layers 112a-112d are provided in FIG. 1A. Accordingly, the device 100 can be divided into a plurality of sections by the sub TSG layers, where each of the sections can include a respective sub TSG layer and the second channel structures that are coupled to the respective sub TSG layer. Thus, the sections can be operated independently by applying appropriate control voltages on the sub TSG layers.

In some embodiments, the word line layers 106 and the first TSG layer 112 can include different materials. For example, the word line layers 106 can include tungsten and the first TSG layer 112 can include polysilicon. The insulating layer 104 can include SiO. The first dielectric layer 114, the second dielectric layer 122, and the separation structures (or TSG cut structures) 124 can include any suitable dielectric materials, such as SiO, SiN, SiCN, SiON, SiC, SiCON, the like, or a combination thereof. The contacts 130 can include a conductive material, such as TiN, Ta, TaN, W, Co, Ru, Al, Cu, the like, or a combination thereof.

Figure 1B:
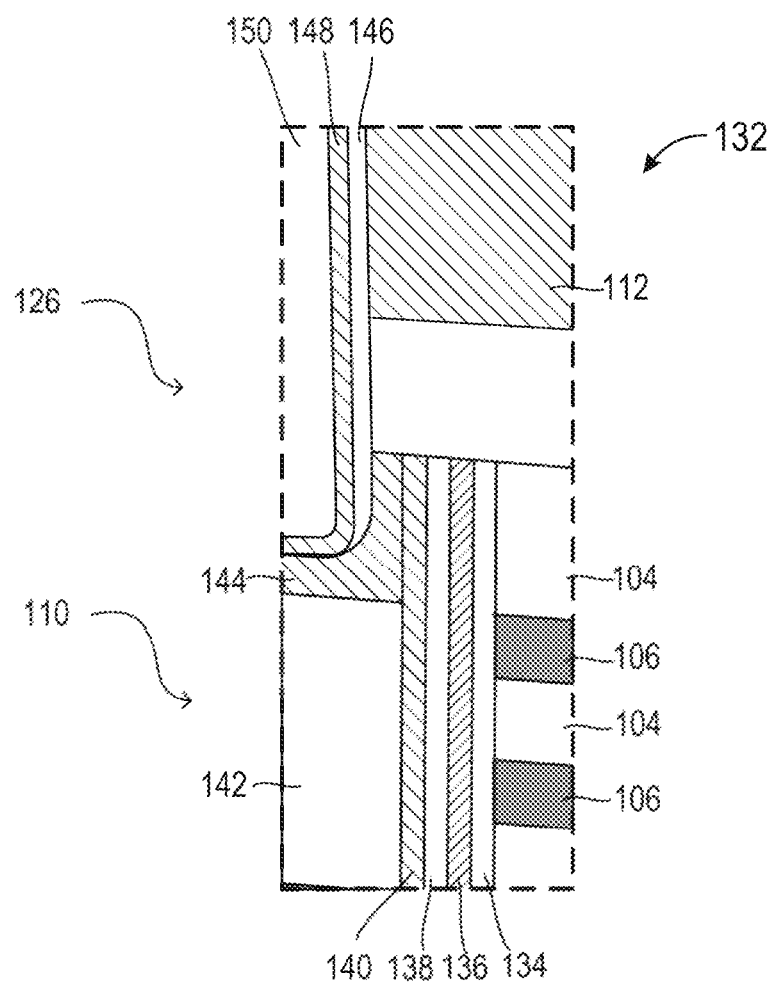
FIG. 1B is an expanded view of a channel structure and a top select gate (TSG) channel structure in the first 3D NAND memory device, in accordance with exemplary embodiments of the disclosure.

FIG. 1B is an expanded view of a first channel structure 110 and a second channel structure 126. As shown in FIG. 1B, the first channel structures 110 can include a blocking layer 134 extending through the insulating layers 104 and the word line layers 106, and extending into the substrate 102. The first channel structure 110 can include a charge storage layer 136 formed over the blocking layer 134, a tunneling layer 138 formed over the charge storage layer 136, and a channel layer 140 formed over the tunneling layer 138. The first channel structure 110 can further include an isolation layer 142 formed over the channel layer 140, and a top channel contact 144 formed over the isolation layer 142 and in contact with the channel layer 140.

The second channel structure 126 can include a gate dielectric layer 146 extending through the first TSG layer 112, the first dielectric layer 114, and into the top channel contact 144 of the first channel structure 110. The second channel structure 126 can include a second channel layer 148 formed along the gate dielectric layer 146 and over top channel contact 144. The second channel layer 148 can further be in contact with the top channel contact 144. The second channel structure 126 can include a second isolation layer 150 formed over the second channel layer 148. The second channel structure 126 can further include a second channel contact 128 (shown in FIG. 1A) formed over the second isolation layer 150 and in contact with the second channel layer 148.

In some embodiments, the blocking layer 134, the tunneling layer 138, the isolation layer 142, and the second isolation layer ISO can include a same composition, such as SiO. The gate dielectric layer 146 can be a SiO layer or a high-k layer. The charge storage layer 136 can be a SiN layer. The channel layer 140, the top channel contact 144, the second channel contact 128, and the second channel layer 148 can include a same composition, such as polysilicon.

The first channel structures 110 and the second channel structures 126 can have a cylindrical shape. However, the present disclosure is not limited thereto, and the first channel structures 110 and second channel structures 126 may be formed in other shapes, such as a square pillar-shape, an oval pillar-shape, or any other suitable shapes.

Figure 2:
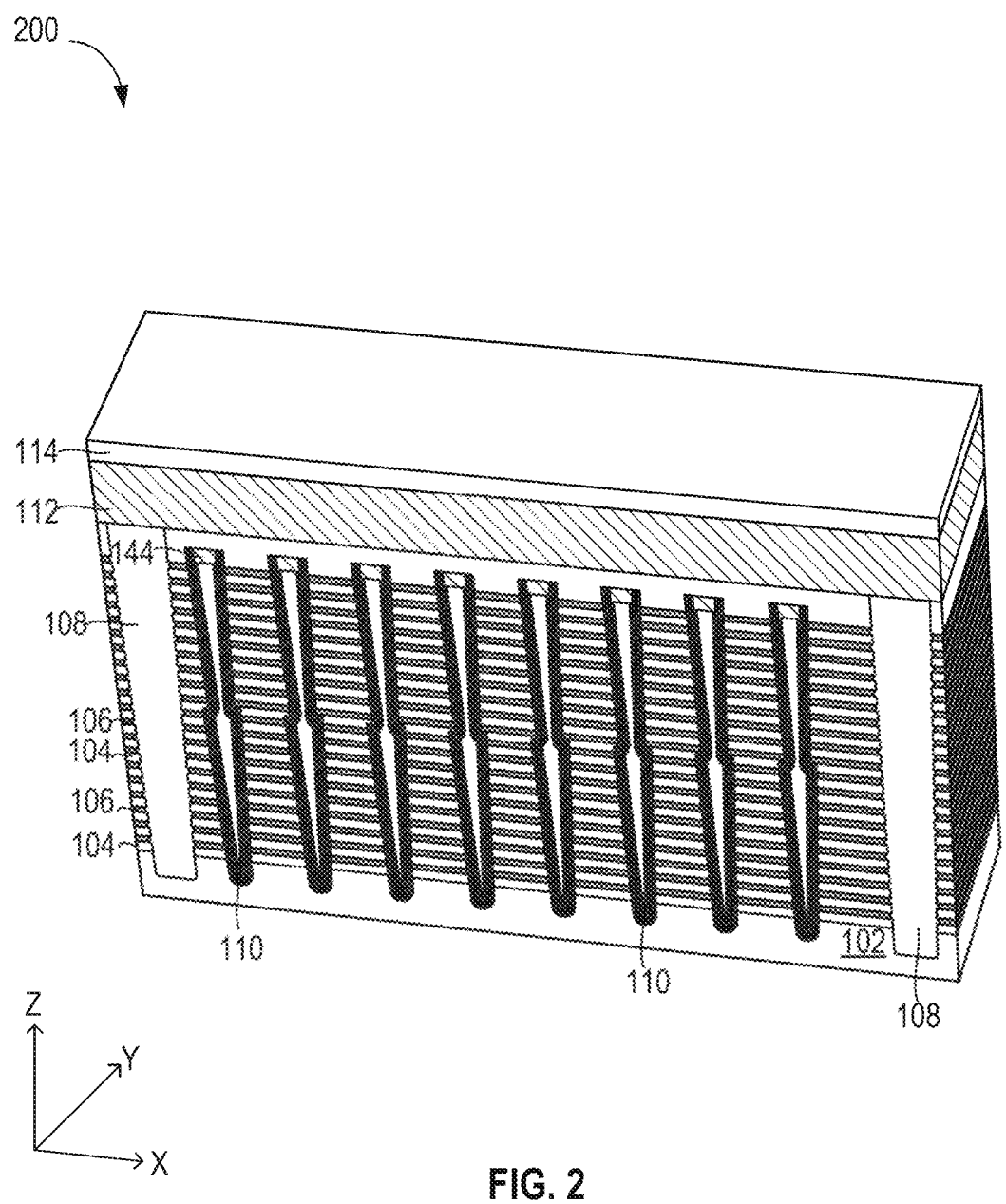
FIGS. 2-7 are perspective views of various intermediate steps of manufacturing the first 3D NAND memory device, in accordance with exemplary embodiments of the disclosure.

FIGS. 2-7 are perspective views of various intermediate steps of manufacturing the 3D NAND memory device 100, in accordance with exemplary embodiments of the disclosure. As shown in FIG. 2, in the semiconductor structure 200, a stack of alternating insulating layers 104 and word line layers 106 can be formed over a substrate 102. A plurality of first channel structures 110 can be formed to extend through the insulating layers 104 and the word line layers 106 and further into the substrate 102. In addition, a plurality of slit structures 108 can be formed to extend through the insulating layers 104 and the word line layers 106 and further into the substrate 102. The slit structures 108 can further extend along the second direction (e.g., Y direction) parallel to the substrate 102. In some embodiments, in order to form the word line layers 106, an initial stack of alternating insulating layers (e.g., 104) and sacrificial layers (not shown) can be formed. The sacrificial layers can further be replaced by a conductive material, such as tungsten, to form the word line layers 106.

Still referring to FIG. 2, a first TSG layer 112 can be formed over the stack of alternating insulating layers 104 and word line layers 106, a first dielectric layer 114 can be formed over the first TSG layer 112.

In order to form the semiconductor structure 200, various semiconductor manufacturing processes can be applied. The semiconductor manufacturing processes can include a deposition process that can include a chemical vapor deposition (CVD), a physical vapor deposition (PVD), a sputtering, an epitaxial deposition, an atomic layer deposition (ALD), or the like. The semiconductor manufacturing processes can also include an etching process, such as a wet etching or a dry etching. The semiconductor process can further include a photolithographic process, an ion implantation process, a metrology process, an inline parametric characterization process, an inline defect characterization process, and so on.

Figure 3:
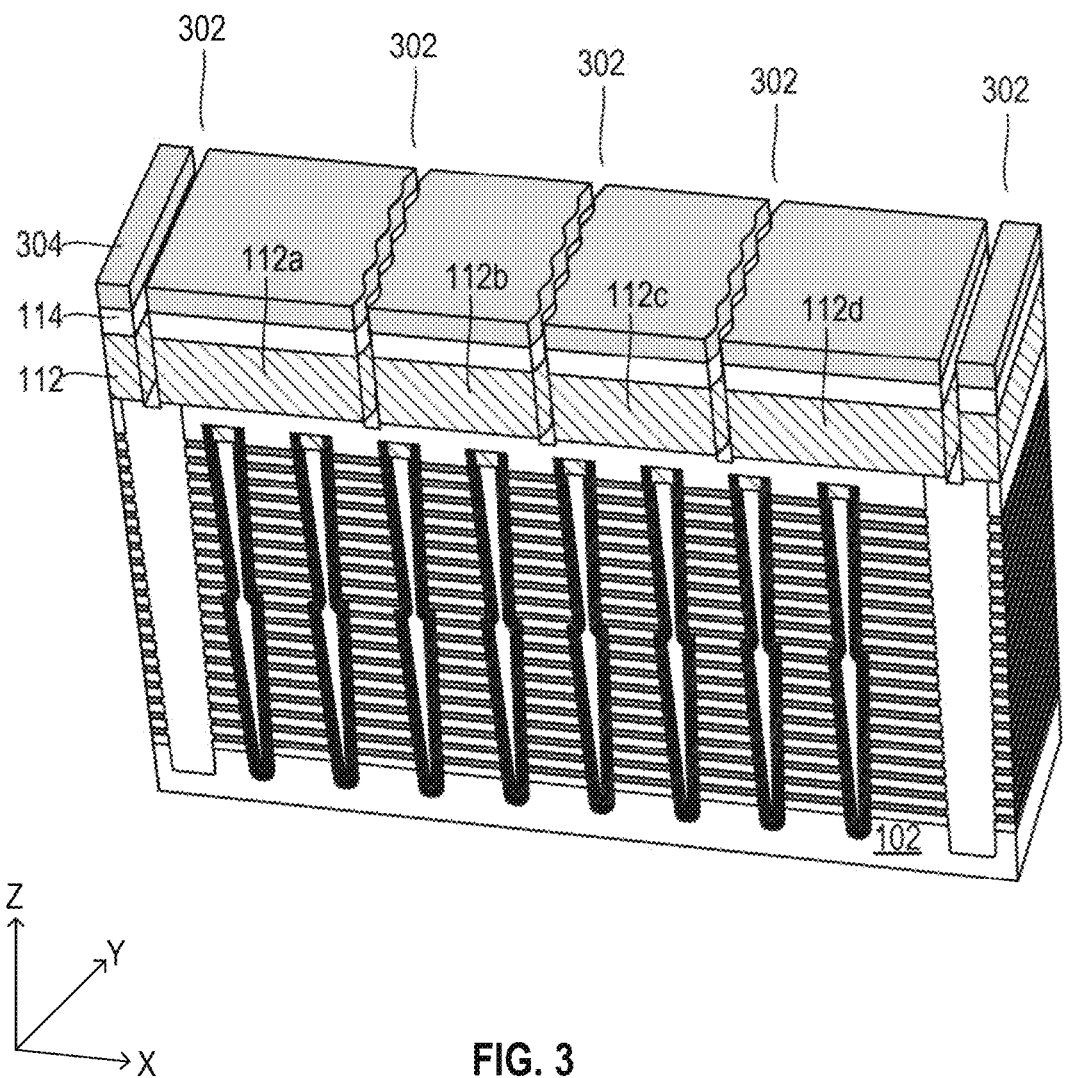

In FIG. 3, a plurality of trenches 302 can be formed in the first TSG layer 112 to divide the first TSG layer 112 into a plurality of sub TSG layers (e.g., 112a-112d). In order to form the trenches 302, a photolithography process can be applied to form a mask layer 304 with patterns. An etching process can subsequently be applied to transfer the patterns into the first dielectric layer 114 and the first TSG layer 112 to form the trenches 302.

Figure 4:
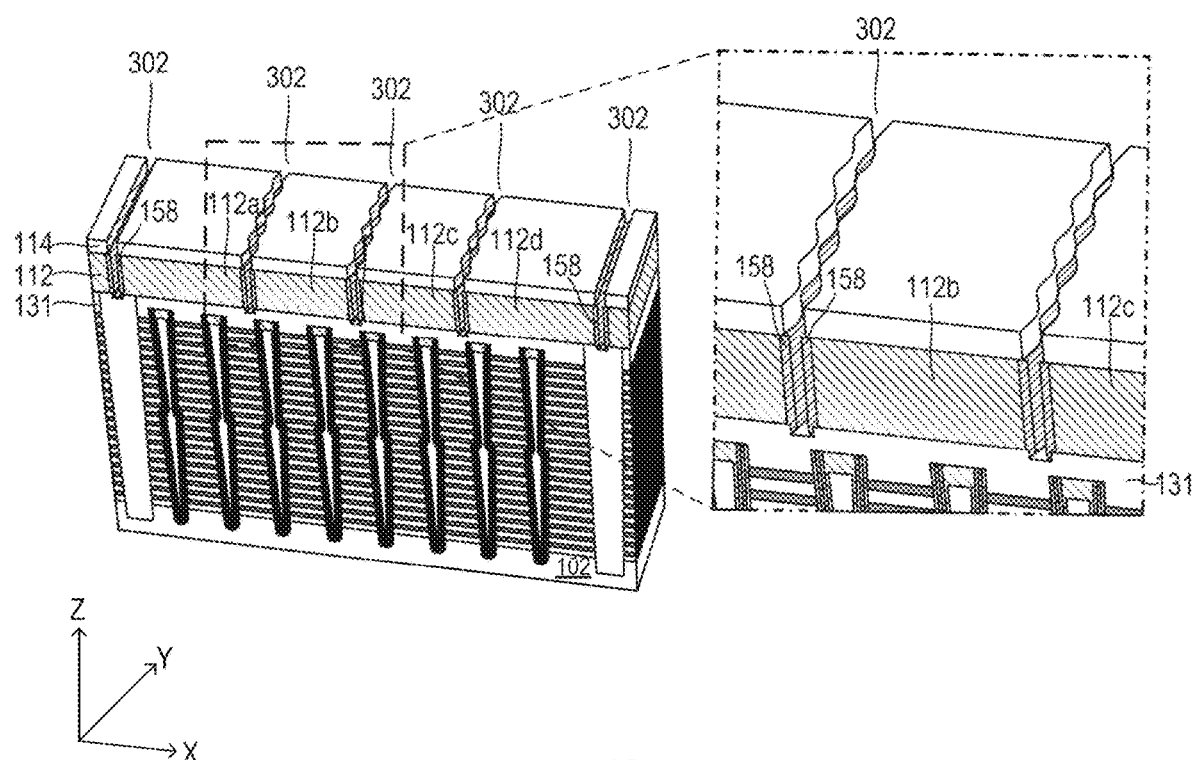

In FIG. 4, conductive layers 158 can be deposited in the trenches 302 and formed on sidewalls of the sub TSG layers 112a-112d. In an exemplary embodiment of FIG. 4, the conductive layers 158 can include a silicide material, such as TiSi, NiSi, WSi, CoSi, or RuSi. In order to form the silicide material on the sidewalls of the sub TSG layers 112*a*-112*d*, a metallic material can be deposited in the trenches 302. In an example, the metallic material can be selectively formed along sidewalls of the sub TSG layers 112*a*-112*d*. In another example, the metallic material can be formed on the sidewalls of the sub TSG layers 112*a*-112*d* and also over the top dielectric layer 131 that is exposed by the trenches 302. Further the metallic material positioned over the top dielectric layer 131 can be removed by an etching process and the metallic material on the sidewalls of the sub TSG layers 112*a*-112*d* can still remain. The metallic material can be Ti, Ni, W, Co, Ru, or the like. An annealing process can subsequently be applied to anneal the metallic material. The metallic material can react with the polysilicon of the first TSG layer 112 to form the silicide material. In another embodiment, a silicide material can be directly deposited on the sidewalls of the sub TSG layers. In yet another embodiment, the conductive layers 158 can include a metallic material which is deposited on the sidewalls of the sub TSG layer 112*a*-112*d*.

Figure 5:
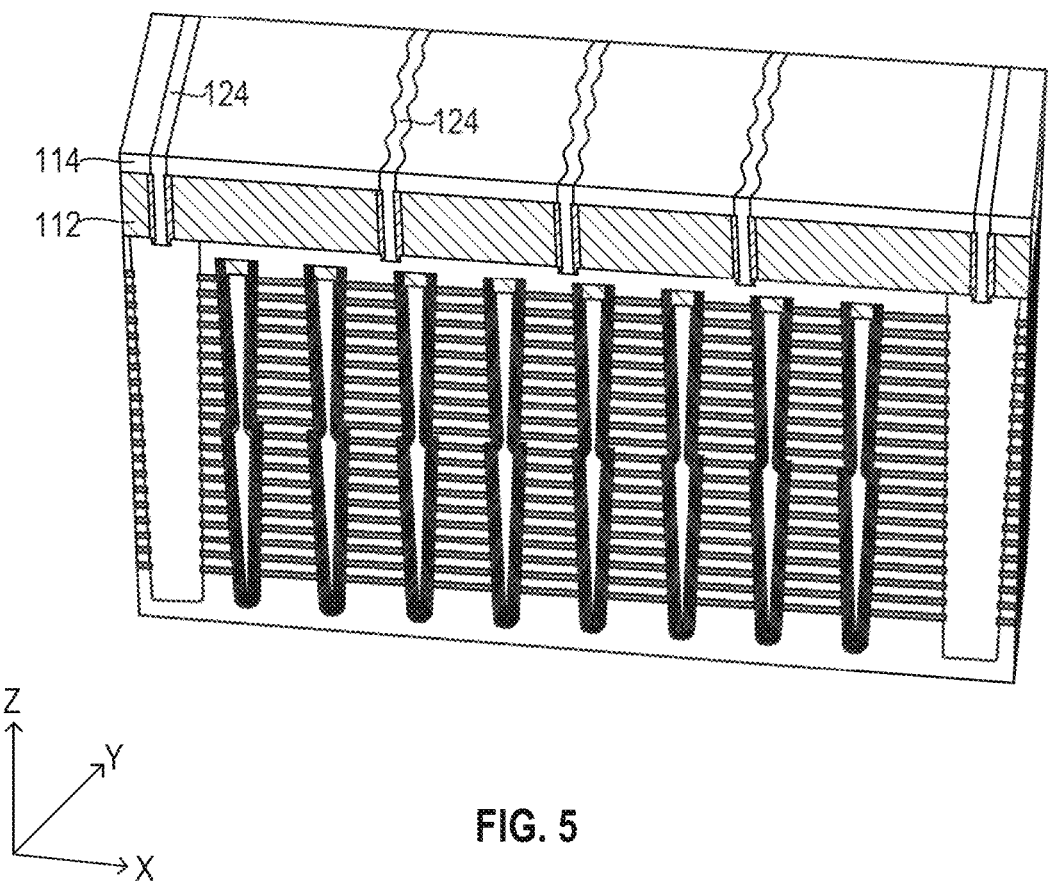

In FIG. 5, a dielectric material can be deposited into the trenches 302 to form separation structures 124. The dielectric material can include SiO, SiN, SiCN, SiON, SiC, SiCON, or the like. The dielectric material can further be deposited over the first dielectric layer 114. In some embodiments, the first dielectric layer 114 can function as a process stop layer for a CMP process. Thus, a surface planarization process, such as a CMP process, can be applied to remove the dielectric material on the first dielectric layer 114, and the first dielectric layer 114 can still remain. The dielectric material that still remains in the trenches 302 becomes the separation structures 124. The separation structures 124, can be formed by any suitable deposition processes, such as a chemical vapor deposition (CVD), a physical vapor deposition (PVD), an atomic layer deposition (ALD), a thermal oxidation, an e-beam evaporation, a sputtering, a diffusion, or any combination thereof.

Figure 6:
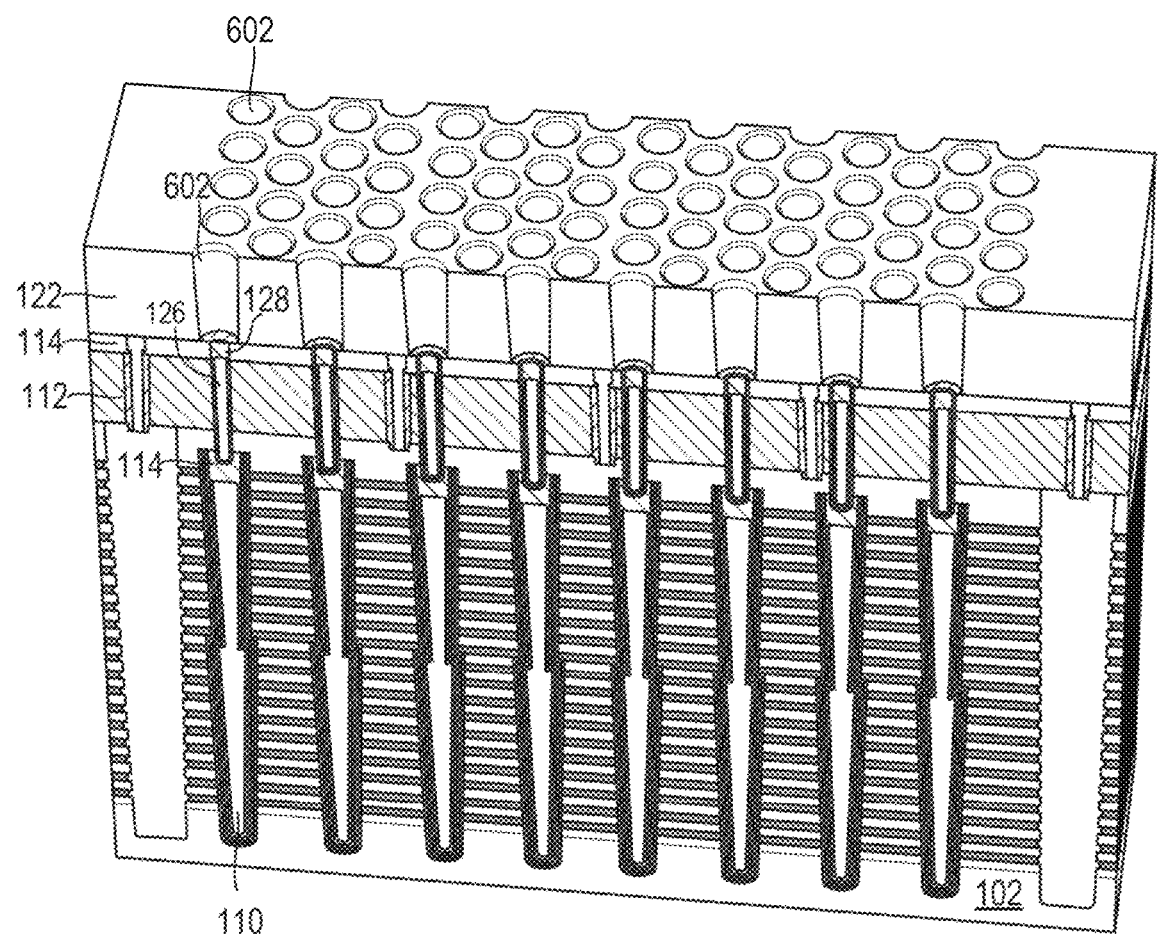

In FIG. 6, a plurality of second channel structures 126 can be formed in the first TSG layer 112 and the first dielectric layer 114. As shown in FIG. 6, the second channel structures 126 can be formed over the top channel contacts 144 of the first channel structures 110, and further extend through the first TSG layer 112 and the first dielectric layer 114. Further, a second dielectric layer 122 can be formed over the first dielectric layer 114. A plurality of contact openings 602 can be formed in the second dielectric layer 122 through a combination of a photolithography process and an etching process. The contact openings 602 can be formed to expose the second channel contacts 128.

Figure 7:
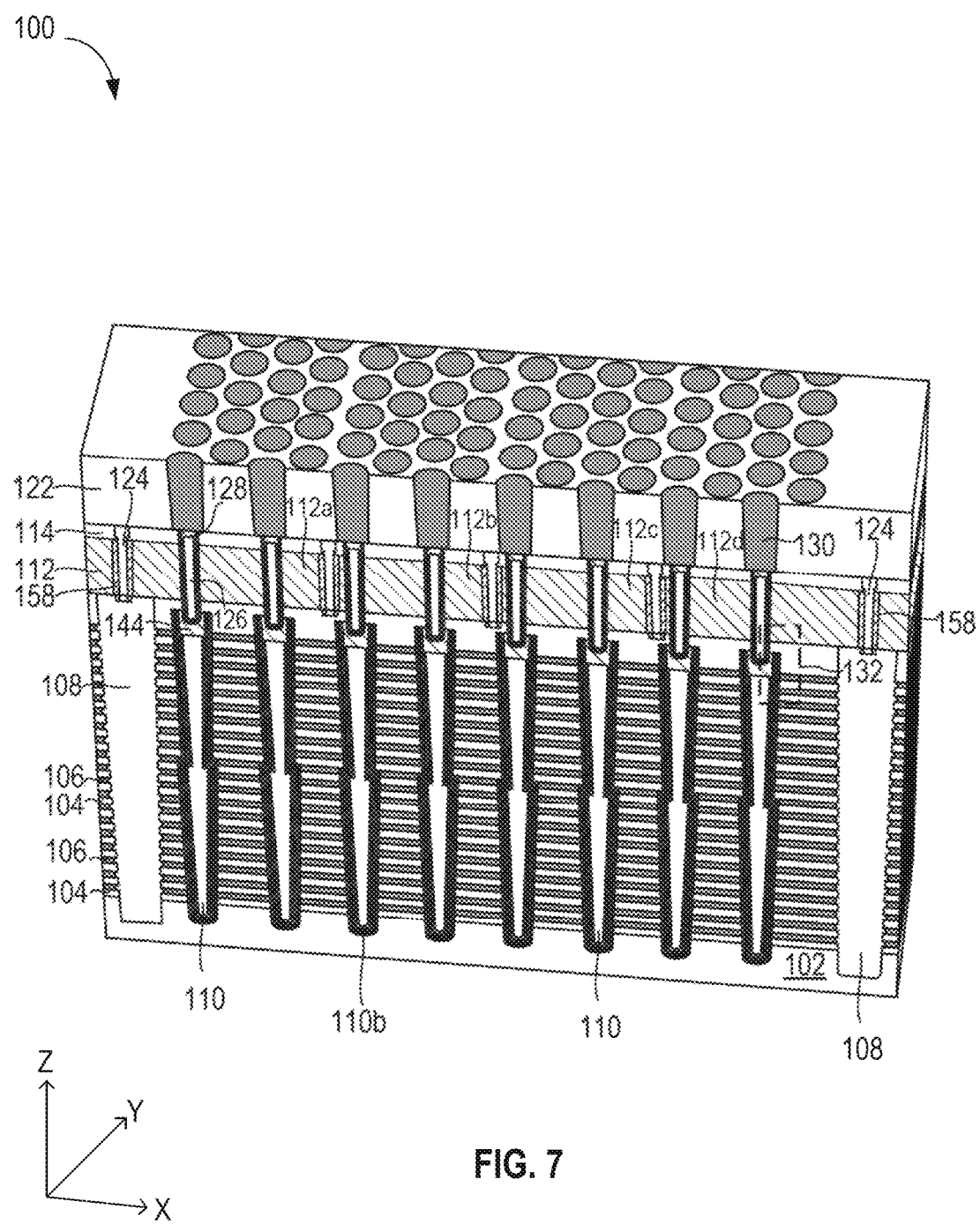

In FIG. 7, a conductive material can be deposited to fill in the contact openings 602. Further, a CMP process can be applied to remove any extra conductive material positioned on the second dielectric layer 122, and the conductive material that remains in the contact openings 602 becomes the contacts 130. The contacts 130 can further be connected to backend of line (BEOL) metals (not shown) on which bias voltages can be applied to operate the second channel structures 126 and the first channel structures 110. In some embodiments, the conductive materials can include W, Co, Ru, Al, Cu, or the like. In some embodiments, a barrier layer, such as TiN, Ta, or TaN, can be deposited between the second dielectric layer 122 and the conductive material.

Still referring to FIG. 7, a 3D NAND memory device (or device) 100 can be formed upon the formation of the contacts 130, which can be similar to the device 100 illustrated in FIG. 1A. For example, in the device 100 of FIG. 7, the stack of alternating insulating layers 104 and word line layers 106 can be formed over the substrate 102. The first channel structures 110 can extend through the insulating layers 104 and the word line layers 106 and further into the substrate 102. The first TSG layer 112 can be formed over the stack, and the first dielectric layer 114 can be formed over the first TSG layer 112. The second channel structures 126 can extend through the first TSG layer 112 and the first dielectric layer 114 and further be positioned over the first channel structures 110. The separation structures 124 can extend through the first TSG layer 112 and the first dielectric layer 114 to divide the first TSG layer 112 into sub TSG layers 112*a*-112*d*. The conductive layers 158 can further be formed along sidewalls of the sub TSG layers 112*a*-112*d*.

Figure 8:
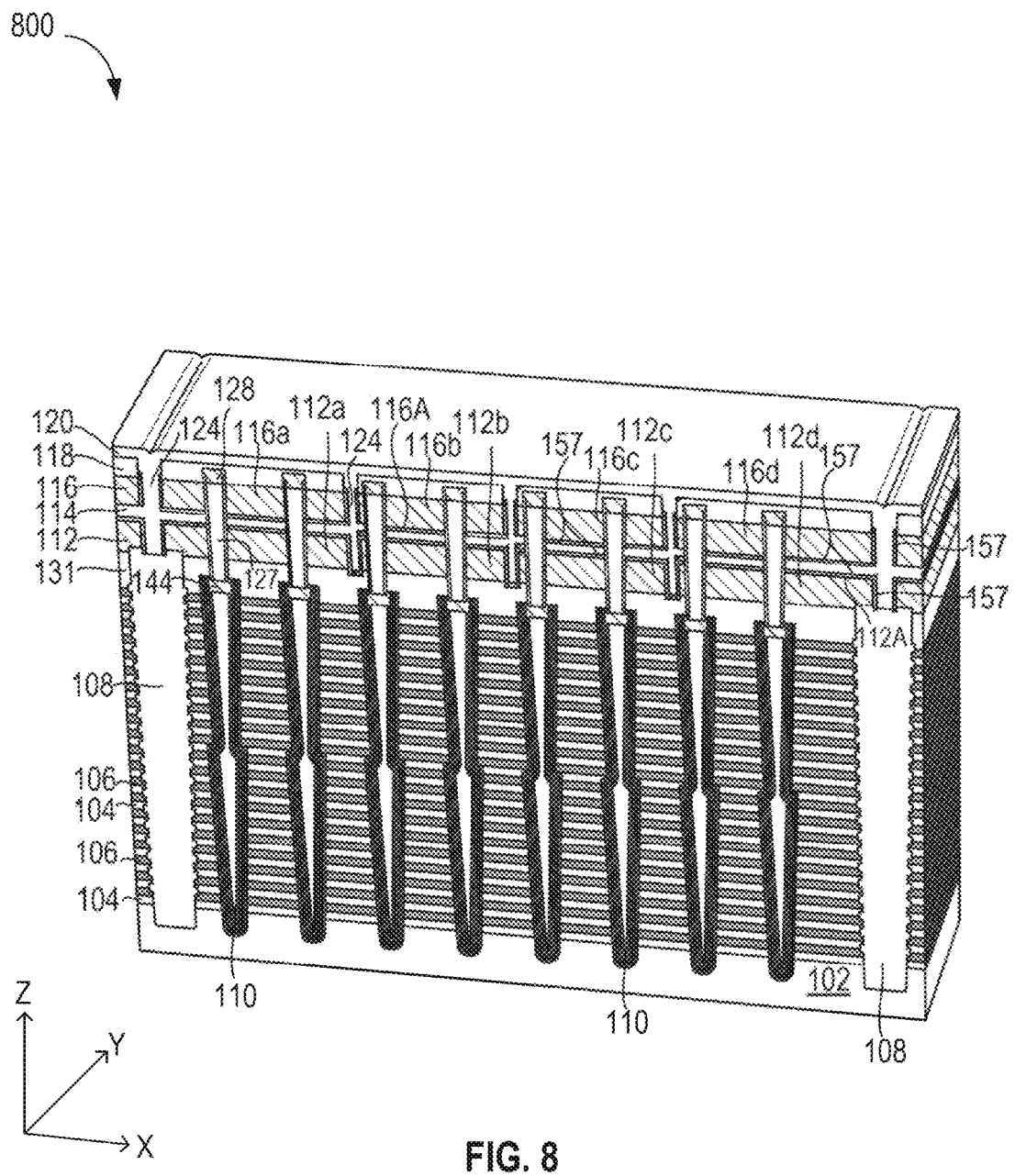
FIG. 8 is a perspective view of a second 3D NAND memory device, in accordance with exemplary embodiments of the disclosure.

FIG. 8 is a perspective view of another exemplary 3D NAND memory device (or device) 800 of the disclosure. Compared to the device 100, the device 800 includes a first TSG layer 112 over the stack of alternating insulating layers 104 and word line layers 106, a second TSG layer 116 positioned over the first TSG layer 112, and a first dielectric layer (or interface layer) 114 positioned between the first TSG layer 112 and the second TSG layer 116. The device 800 includes a plurality of separation structures 124 extending through the first TSG layer 112, the first dielectric layer 114, and the second TSG layer 116 to divide the first TSG layer 112 into sub TSG layers 112*a*-112*d*, and the second TSG layer 116 into sub TSG layers 116*a*-116*d*. The device 800 can include a second dielectric layer 118 over the second TSG layer 116, and a plurality of second channel structures 127 positioned over and coupled to top channel contacts 144 of the first channel structures 110, and further extending through the first TSG layer 112, the first dielectric layer 114, the second TSG layer 116, and the second dielectric 118.

Still referring to FIG. 8, the device 800 can include a third dielectric layer 120 over the second dielectric layer 118 and conductive layers 157. The conductive layers 157 can be formed along one or more sidewalls of the sub TSG layers (e.g., 112*a*-112*d* and 116*a*-116*d*), and positioned between the sub TSG layers and the separation structures 124. The conductive layers 157 can also be formed over one or more surfaces of the TSG layers such as a top surface 112A of the first TSG layer 112 and a bottom surface 116A of the second TSG layer 116. Accordingly, as shown in FIG. 8, the conductive layers 157 can be positioned between the first TSG layer 112 and the first dielectric layer 114, and between the first dielectric layer 114 and the second TSG layer 116. The conductive layers 157 can be similar to the conductive layers 158 in FIG. 1A, which can include a silicide material. Accordingly, the second channel structures 127 can further extend through the conductive layer 157 positioned between the first dielectric layer 114 and the first TSG layer 112, and the conductive layer 157 positioned between the first dielectric layer 114 and the second TSG layer 116.

FIGS. 9-14 are perspective views of various intermediate steps of manufacturing the 3D NAND memory device 800, in accordance with exemplary embodiments of the disclosure. As shown in FIG. 8, a semiconductor structure 900 can be formed firstly. In the semiconductor structure 900, a stack of alternating insulating layers 104 and word line layers 106 can be formed over a substrate 102. A plurality of first channel structures 110 can be formed to extend through the insulating layers 104 and the word line layers 106 and further into the substrate 102. In addition, a plurality of slit structures 108 can be formed to extend through the insulating layers 104 and the word line layers 106 and further into the substrate 102. The slit structures 108 can further extend along the second direction (e.g., Y direction) parallel to the substrate 102.

Figure 9:
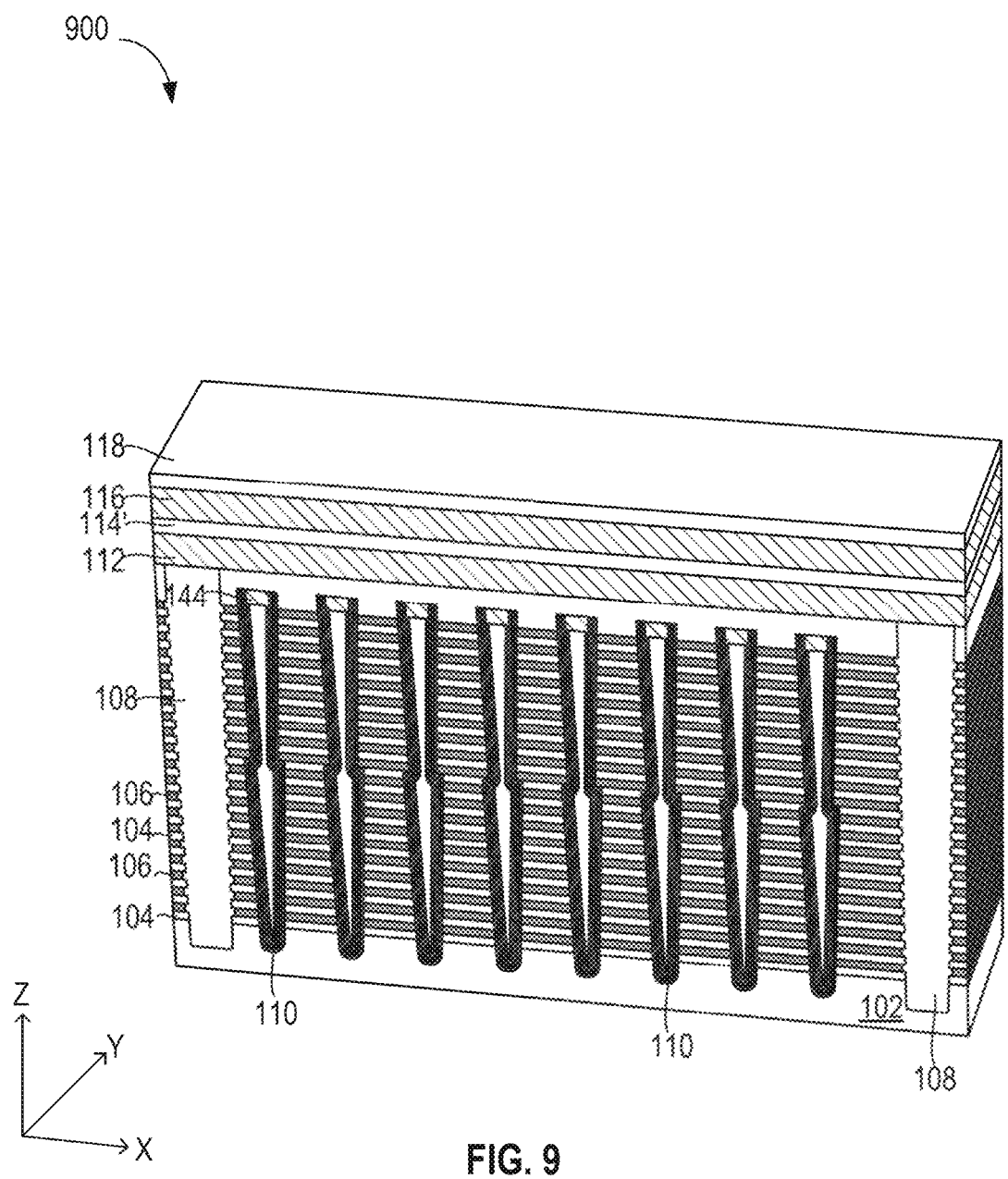
FIGS. 9-14 are perspective views of various intermediate steps of manufacturing the second 3D NAND memory device, in accordance with exemplary embodiments of the disclosure.

Still referring to FIG. 9, the semiconductor structure 900 can include a first TSG layer 112 over the stack of alternating insulating layers 104 and word line layers 106, a sacrificial layer 114' over the first TSG layer 112, a second TSG layer 116 over the sacrificial layer 114', and a second dielectric layer 118 over the second TSG layer 116.

Figure 10:
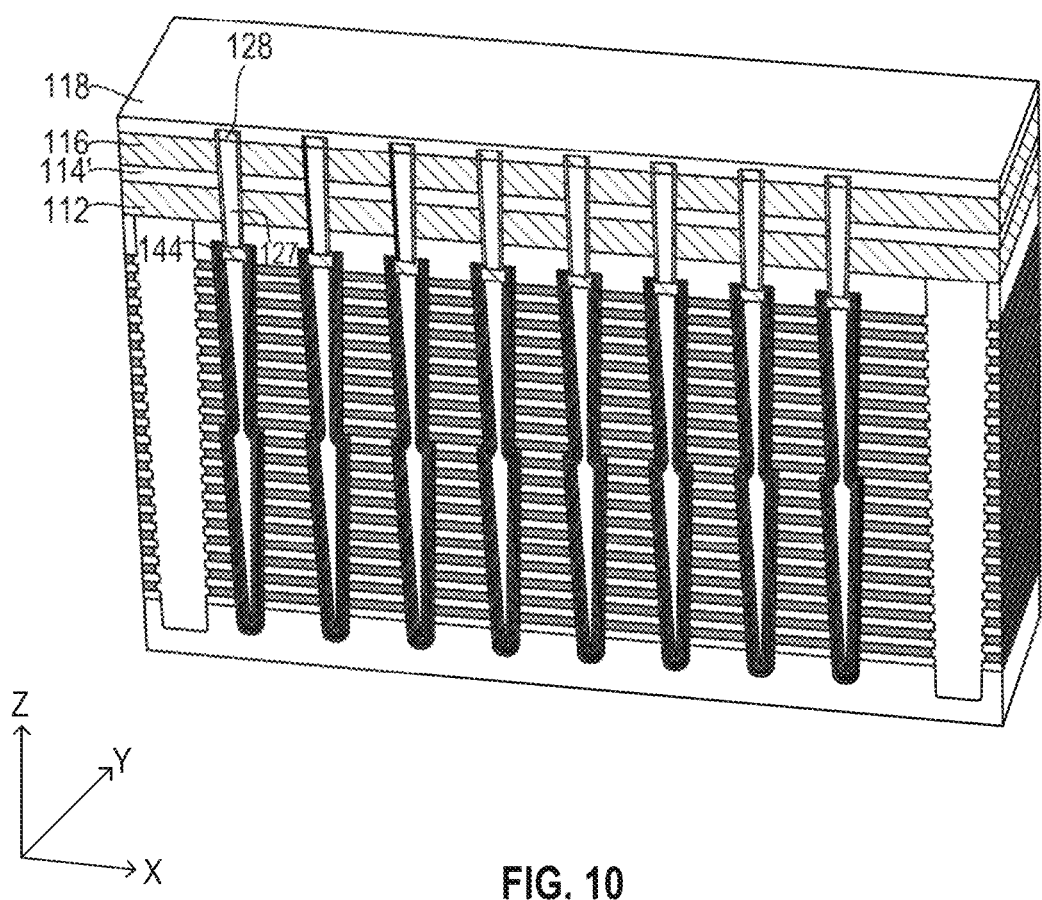

In FIG. 10, a plurality of second channel structures 127 can be formed. The TSG channel structures 127 can extend from the top channel contacts 144 of the first channel structures 110, and further through the first TSG layer 112, the sacrificial layer 114', the second TSG layer 116, and the second dielectric layer 118. In an embodiment of FIG. 10, the second channel structures 127 can have similar features to the second channel structures 126 in FIG. 1B.

Figure 11:
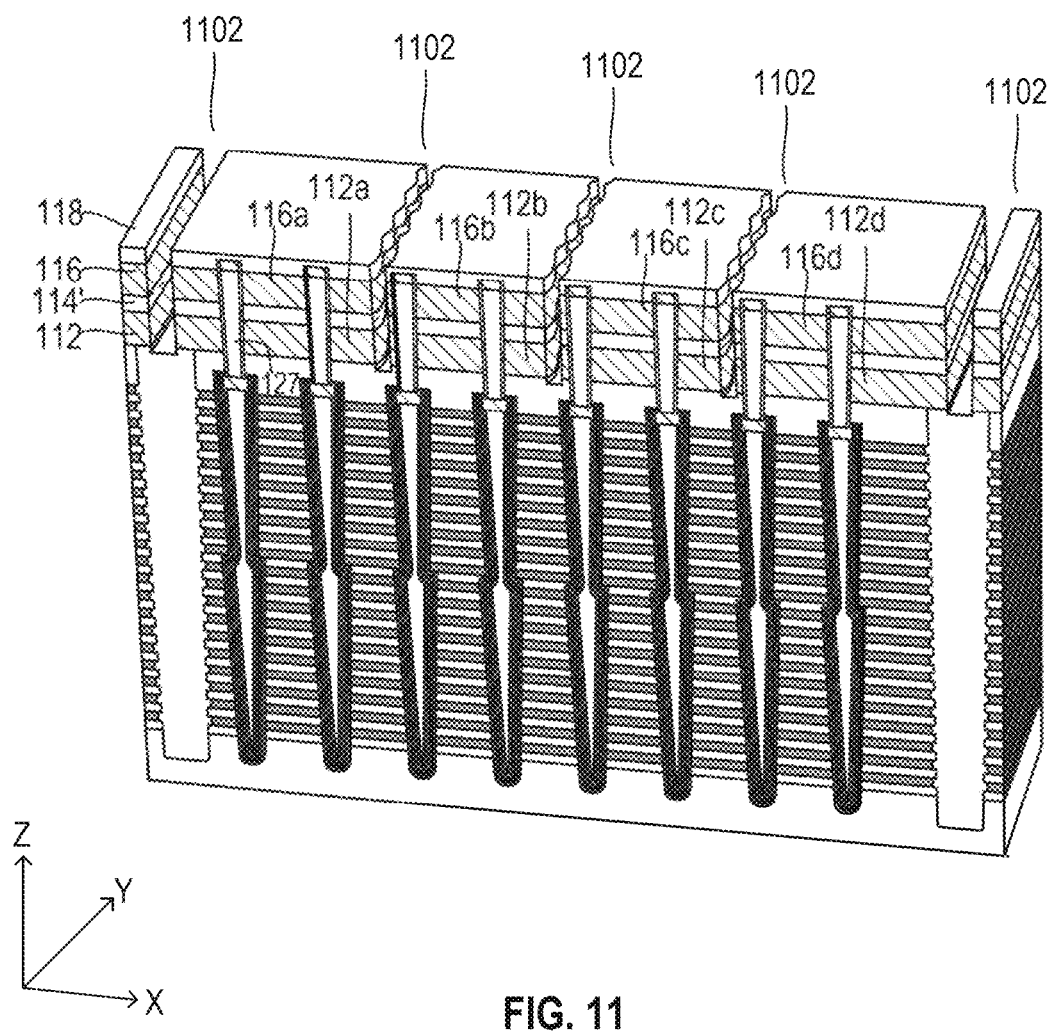

In FIG. 11, a plurality of trenches 1102 can be formed to extend through the first TSG layer 112, the sacrificial layer 114', the second TSG layer 116, and the second dielectric layer 118. Thus, the first TSG layer 112 can be divided by the trenches 1102 into a plurality of sub TSG layers 112a-112d, and the second TSG layer 116 can be divided by the trenches 1102 into a plurality of sub TSG layers 116a-116d.

Figure 12:
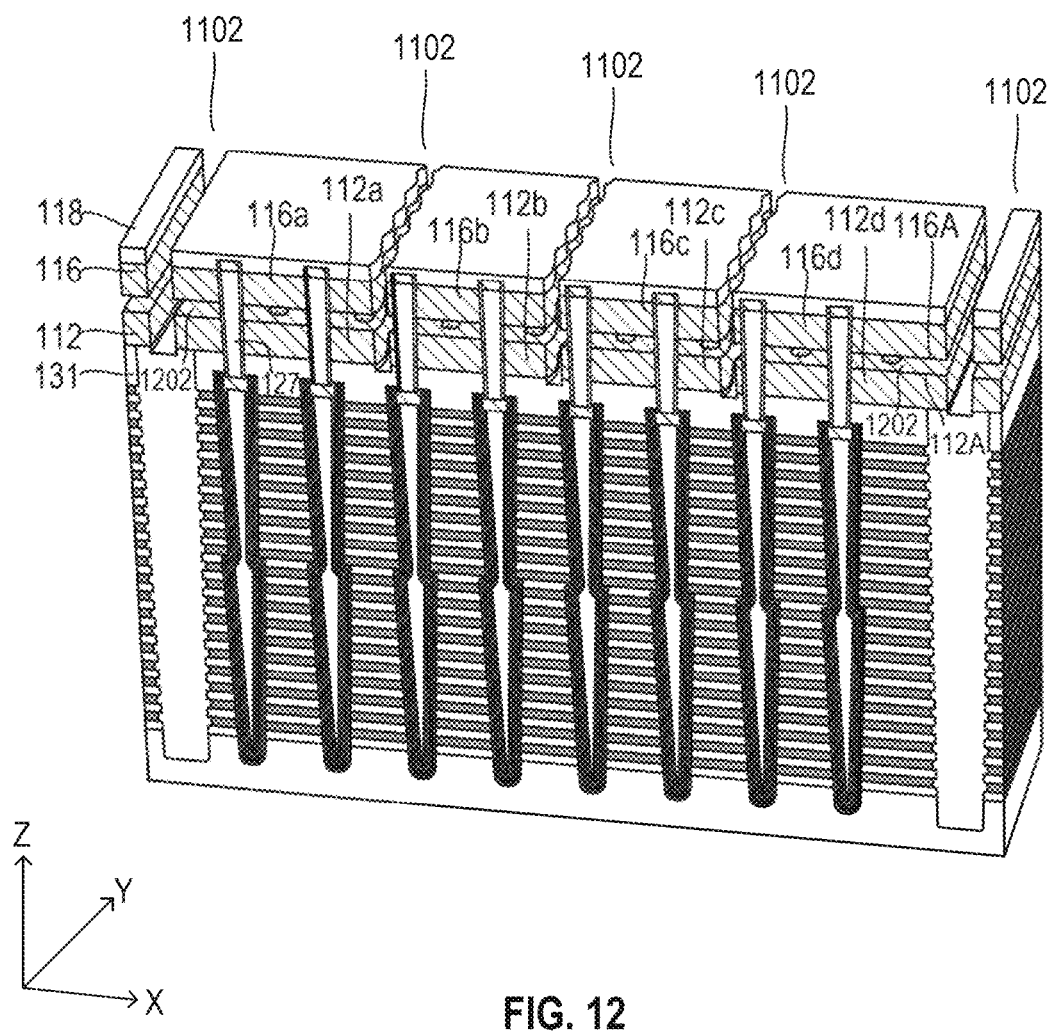

In FIG. 12, an etching process can be applied to remove the sacrificial layer 114'. Thus, a top surface 112A of the first TSG layer 112, a bottom surface 116A of the second TSG layer 116, and sidewalls of the sub TSG layers (e.g., 112a-112d, and 116a-116d) can be exposed. Accordingly, spaces 1202 can be formed between the first TSG layer 112 and the second TSG layer 116. The etching process can be a wet etch or a dry etch. The etching process can selectively remove the sacrificial layer 114' without affecting adjacent structures, such as the first and second TSG layers 112 and 116, and the second channel structures 127.

Figure 13:
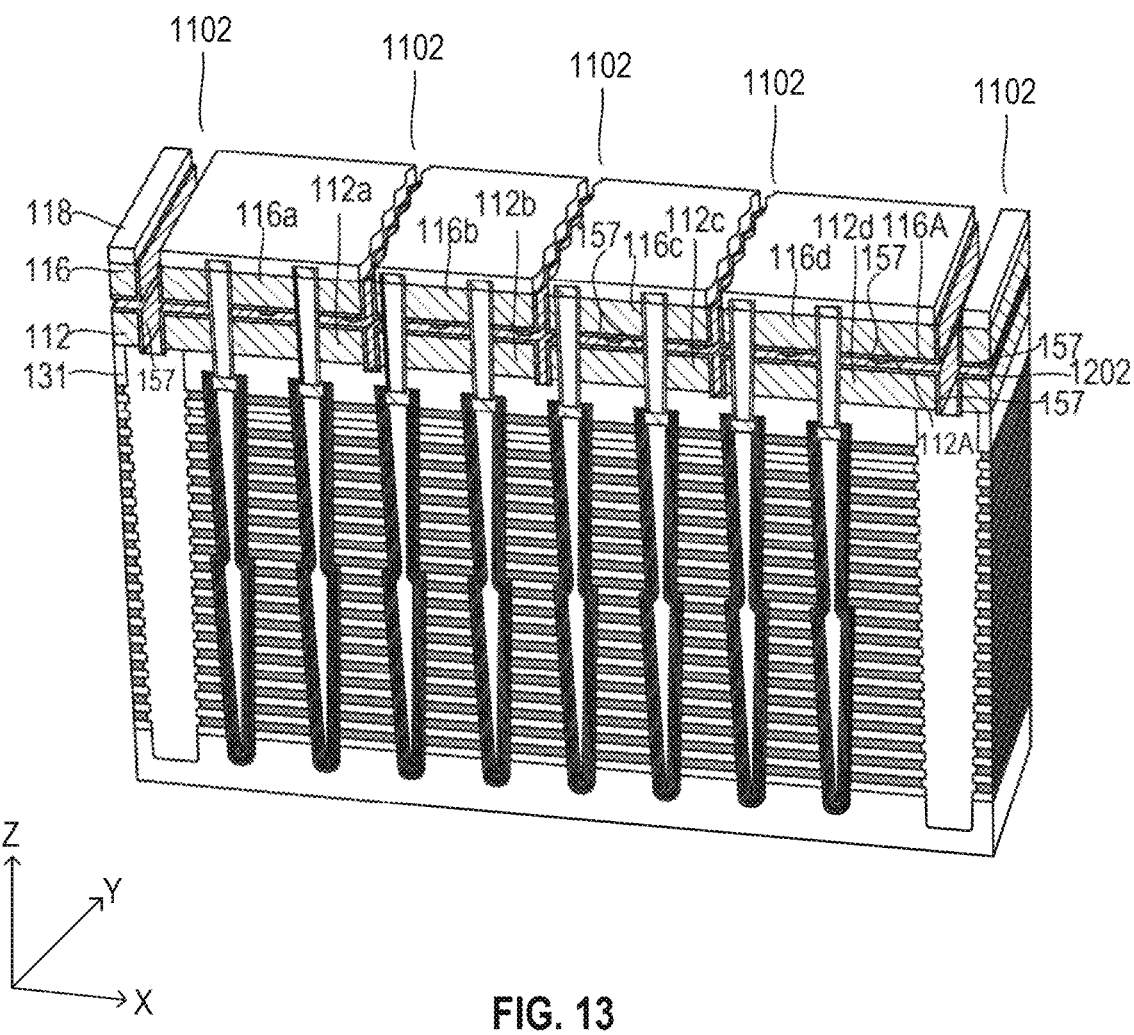

In FIG. 13, conductive layers 157 can be formed along one or more sidewalls of the sub TSG layers (e.g., 112a-112d and 116a-116d). The conductive layers 157 can also be formed over one or more surfaces of the TSG layers such as the top surface 112A of the first TSG layer 112 and the bottom surface 116A of the second TSG layer 116. In order to form the conductive layers 157, a metallic material can be deposited in the trenches 1102. In an example, a selective deposition process can be applied such that the metallic material can be selectively formed along sidewalls of the sub TSG layers (e.g., 112a-112d and 116a-116d), the top surface 112A of the first TSG layer 112, and the bottom surface 116A of the second TSG layer 116. In another example, the metallic material can be also formed over the top dielectric layer 131 that is exposed by the trenches 1102. Further the metallic material positioned over the top dielectric layer 131 can be removed by an etching process and the metallic material on the sidewalls of the sub TSG layers (e.g., 112a-112d and 116a-116d), the top surface 112A of the first TSG layer 112, and the bottom surface 116A of the second TSG layer 116 can still remain.

Figure 14:
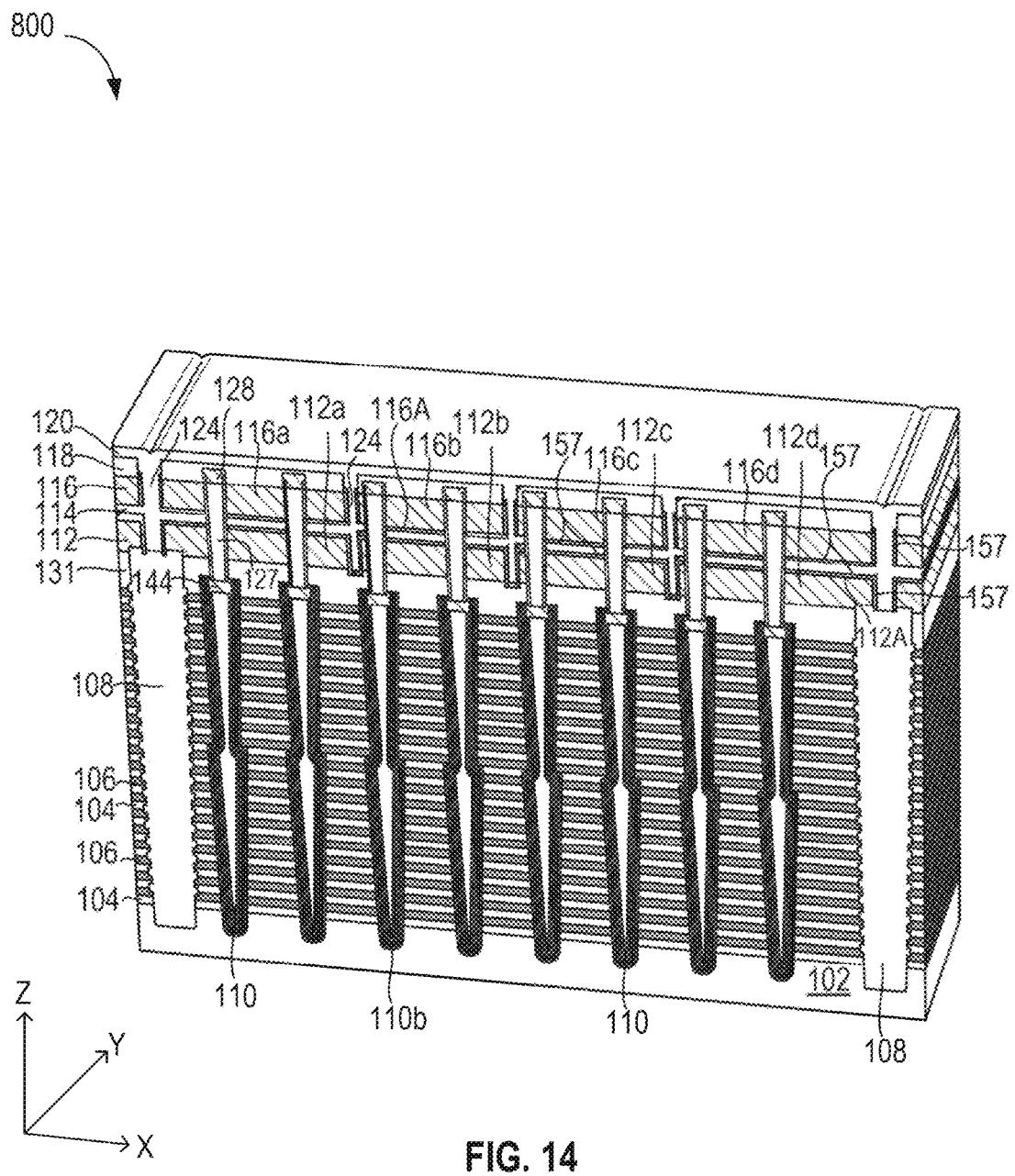

In FIG. 14, a dielectric material can be deposited into the trenches 1102 to form separation structures 124. The dielectric material can also be deposited into the spaces 1202 to form the first dielectric layer 114. The dielectric material can further be deposited over the second dielectric layer 118 to form the third dielectric layer 120. In some embodiments, a surface planarization process, such as a mechanical chemical polishing (CMP) process, can be applied to flatten the third dielectric layer 120. In an exemplary embodiment of FIG. 14, the separation structures 124, the first dielectric layer 114, and the third dielectric layer 120 can be include a same composition such as SiO or other suitable dielectric materials. When the separation structures 124, the first dielectric layer 114, and the third dielectric layer 120 are formed, a device 800 can be formed accordingly. In some the device 800 in FIG. 14 can be similar to the device 800 in FIG. 8.

It should be noted that the processes illustrated in FIGS. 9-14 can be performed in different orders. For example, when the semiconductor structure 900 is formed in FIG. 9, the processes shown in FIGS. 11-14 can be performed at first to form the separation structures 124 and the conductive layers 157. Subsequently, the process shown in FIG. 10 can be performed to form the second channel structures 127.

In the disclosure, FIG. 1A provides one TSG layer (e.g., 112) in the device 100 and FIG. 8 provides two TSG layers (e.g., 112 and 116) in the device 800. However, FIGS. 1A and 8 are merely examples, and the device 100 or the device 800 can include any number of TSG layers according to the device structures.

Further, the conductive layers (e.g., 157 or 158) can be positioned at any appropriate positions in the device (e.g., 100 or 800). In an embodiment, as shown in FIG. 1A, the conductive layers 158 can be positioned along sidewalls of the separation structures (e.g., 124). In another embodiment, as shown in FIG. 8, the conductive layers 157 can be positioned along the sidewalls of the separation structures and between the TSG layers. In yet another embodiment, the conductive layers can be positioned only between the TSG layers. For example, the conductive layers 157 may only be positioned on the top surface 112A of the first TSG layer 112 and the bottom surface 116A of the second TSG layer 116.

In some embodiments, one or more dummy TSG layers can be positioned between the TSG layers and the stack of word line layers and insulating layers. The one or more dummy TSG layers can help control the voltage change of TSTs and avoid the threshold voltage change of TSTs caused by boron diffusion in the manufacturing process. The one or more dummy TSG layers can also be used as etch stop layers when the TSG layers are etched by an etching process to form TSG cut structures that divide the TSG layers into a plurality of sub TSG layers, where the etch stop layers can improve the etch uniformity of the etching process.

Figure 15:
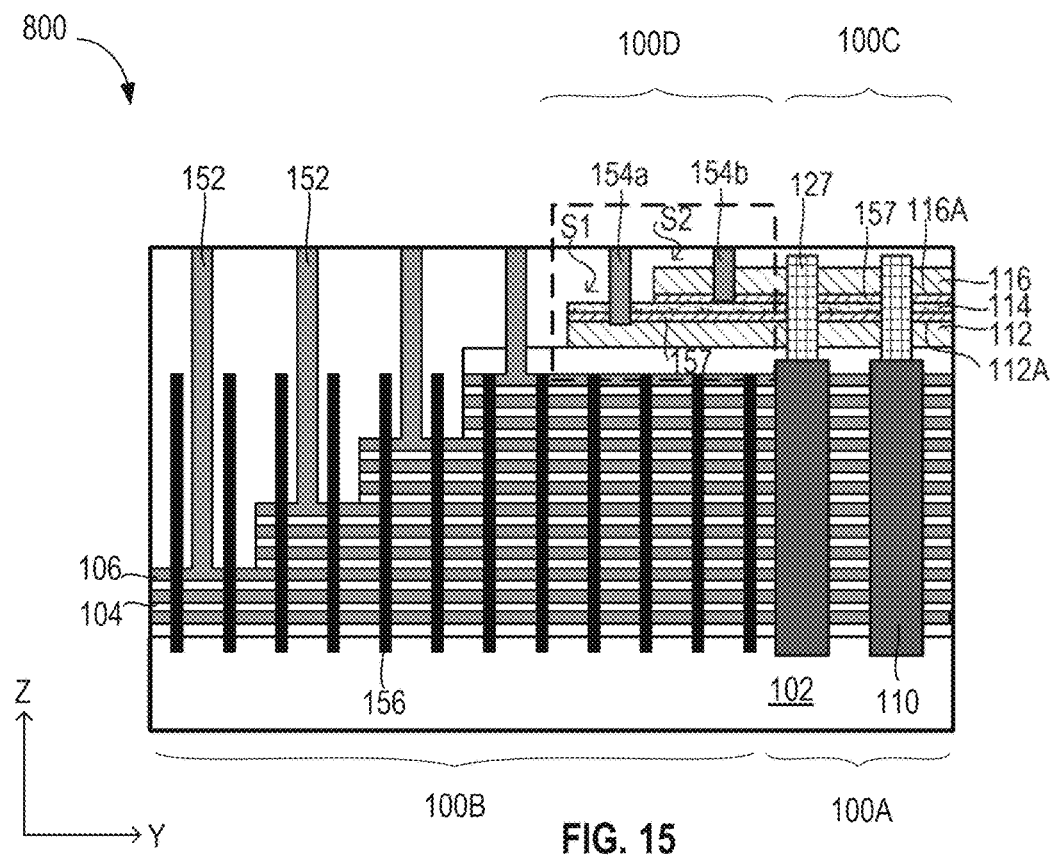
FIG. 15 is a first cross-sectional view of the second 3D NAND memory device, in accordance with exemplary embodiments of the disclosure.

FIG. 15 shows a first exemplary cross-sectional view of the device 800. As shown in FIG. 15, the stack of insulating layers 104 and the word line layers 106 can include a staircase region 100B and an array region 100A. The first channel structures 110 can extend through the insulating layers 104 and the word line layers 106 at the array region 100A. The staircase region 100B of the stack can include a plurality of stairs, and each of the plurality of stairs can include a respective pair of the word line layer 106 and the insulating layer 104. A plurality of word line contacts 152 can extend from the plurality of stairs.

Still referring to FIG. 15, the first TSG layer 112 and the second TSG layer 116 can further include a TSG staircase region 100D and a TSG array region 100C, where the TSG staircase region 100D is positioned over the staircase region 100B of the stack, and the TSG array region 100C is positioned over the array region 100A of the stack. The second channel structures 127 can be positioned in the TSG array region 100C. As shown in FIG. 15, the second channel structures 127 can be positioned over and coupled to the first channel structures 110, and further extend through the first TSG layer 112, the conductive layers 157 positioned on the top surface 112A of the first TSG layer 112, the first dielectric layer 114, the conductive layer 157 positioned on the bottom surface 116A of the second TSG layer 116, and the second TSG layer 116. For clarity and simplicity, details of the first channel structures 110 and the second channel structures 127 are not provided in FIG. 15.

Figure 16:
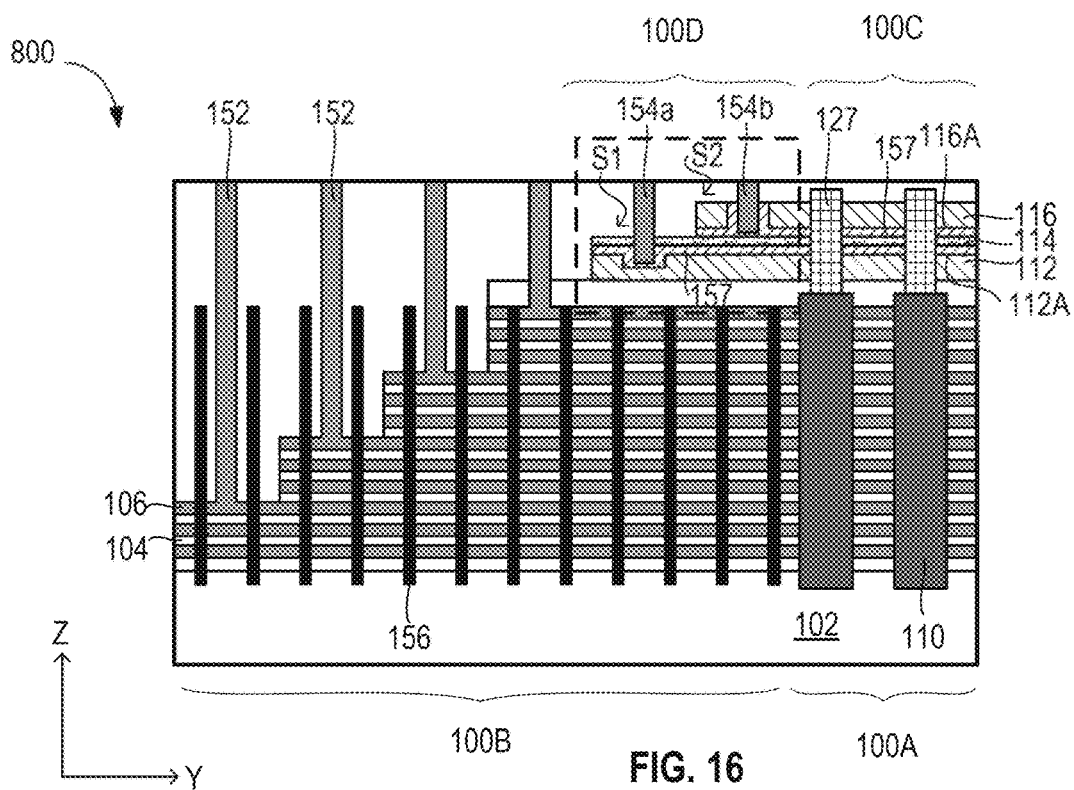
FIG. 16 is a second cross-sectional view of the second 3D NAND memory device, in accordance with exemplary embodiments of the disclosure.

The TSG staircase region 100D can include one or more stairs. Each of the stairs can include one or more TSG layer. In an embodiment, as shown in FIGS. 15 and 16, the TSG staircase region 100D can include two stairs that includes a first stair S1 and a second stair S2. The first stair S1 can include the first TSG layer 112 and the second stair S2 can include the second TSG layer 116. As shown in FIG. 15, the device 800 can include also a first TSG contact 154a positioned at the first stair S1 and a second TSG contact 154b positioned at the second stair S2. The first TSG contact 154a can extend through the first dielectric layer 114 and the conductive layer 157 that is formed on the top surface 112A of the first TSG layer 112. Accordingly, the first TSG contact 154a can be in contact with the first TSG layer 112. The second TSG contact 154b can extend through the second TSG layer 116 and the conductive layer 157 that is formed on the bottom surface 116A of the second TSG layer 116. Accordingly, the second TSG contact 154b can be in contact with the first dielectric layer 114.

In another embodiment, as shown in FIG. 16, the conductive layers 157 can be positioned between a side portion of the second TSG contact 154b and the second TSG layer 116, and between a bottom portion of the first TSG contact 154a and the first TSG layer 112.

As shown in FIGS. 15 and 16, the conductive layers 157 can be formed in different locations of the TSG staircase region 100D. In order to form the conductive layers 157 shown in FIG. 15, the first TSG contact 154a and the second TSG contact 154b can be formed prior to the formation of the conductive layers 157. For example, the first TSG contact 154a and the second TSG contact 154b can be formed after the first TSG layer 112 and the second TSG layer 116 are formed in FIG. 9. Then the sacrificial layer 114' positioned in TSG staircase region 100D can be removed based on the process in FIG. 12 and the conductive layers 157 can be formed in staircase region 100D based on the process in FIG. 13. In order to form the conductive layers 157 shown in FIG. 16, contact openings (not shown) can be formed at the first stair S1 and the second stair S2 together with the trenches 1102 based on the process in FIG. 11. Further, the conductive layers 157 can be deposited in the spaces 1202 and the contact openings based on the process in FIG. 13. A conductive material can then be filled in the contact openings to form the first TSG contact 154a and the second TSG contact 154b.

Compared to the first TSG contact 154a and the second TSG contact 154b shown in FIG. 15, the first TSG contact 154a and the second TSG contact 154b shown in FIG. 16 can have a better contact between the first TSG contact 154a and the first TSG layer 112, and between the second TSG contact 154b and the second TSG layer 116 because the conductive layers 157 are formed between the first TSG contact 154a and the first TSG layer 112, and between the second TSG contact 154b and the second TSG layer 116.

It should be noted that a plurality of dummy channel structures 156 can be included in the device 800. The dummy channel structures 156 can extend through the insulating layers 104 and the word line layers 106 both at the staircase region 100B and the array region 100A, and further into the substrate 102. The dummy channel structures 156 can serve as sustain components to support the staircase region 100B and/or the array region 100A when the sacrificial layers (not shown) are removed to form the word line layers 106. In an embodiment of FIGS. 15 and 16, the dummy channel structures 156 are formed with the first channel structures 110 together and have a similar structure to the first channel structures 110. Thus, the dummy structures can also include a blocking layer, a charge storage layer, a tunneling layer, and a channel layer. In another embodiment, the dummy channel structures 156 have a structure that is different from the first channel structures 110. For example, the dummy channel structures 156 can include a dielectric material, such as SiO, SiN, or other suitable dielectric materials.

Figure 17:
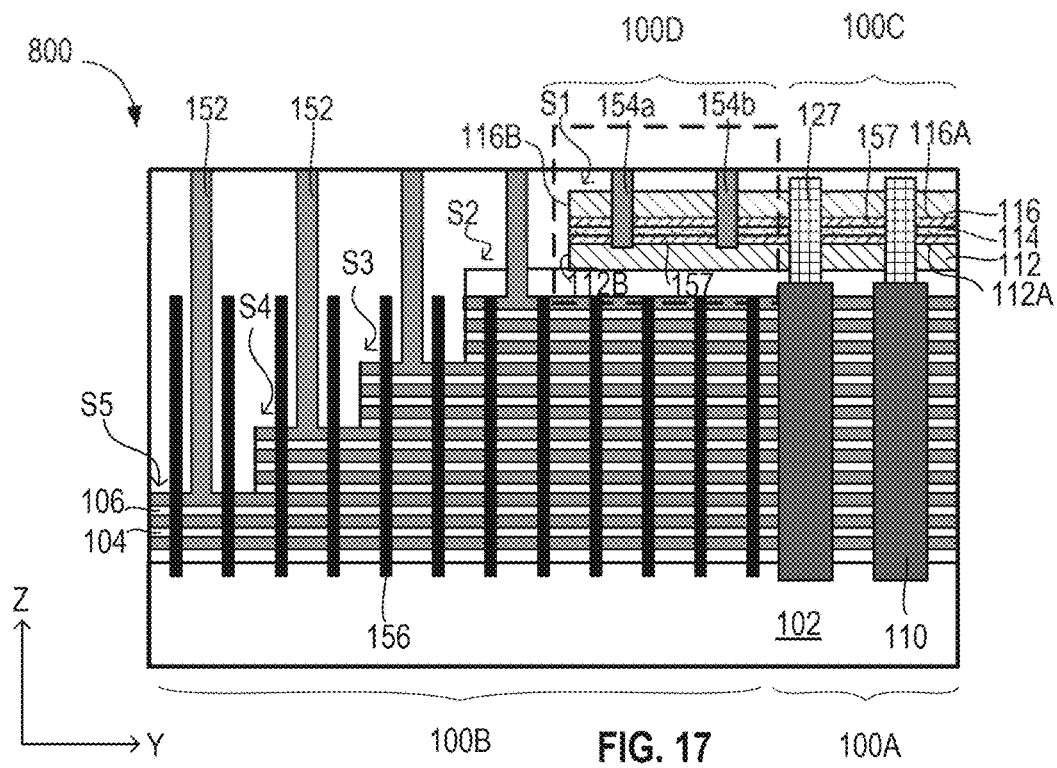
FIG. 17 is a third cross-sectional view of the second 3D NAND memory device, in accordance with exemplary embodiments of the disclosure.
Figure 18:
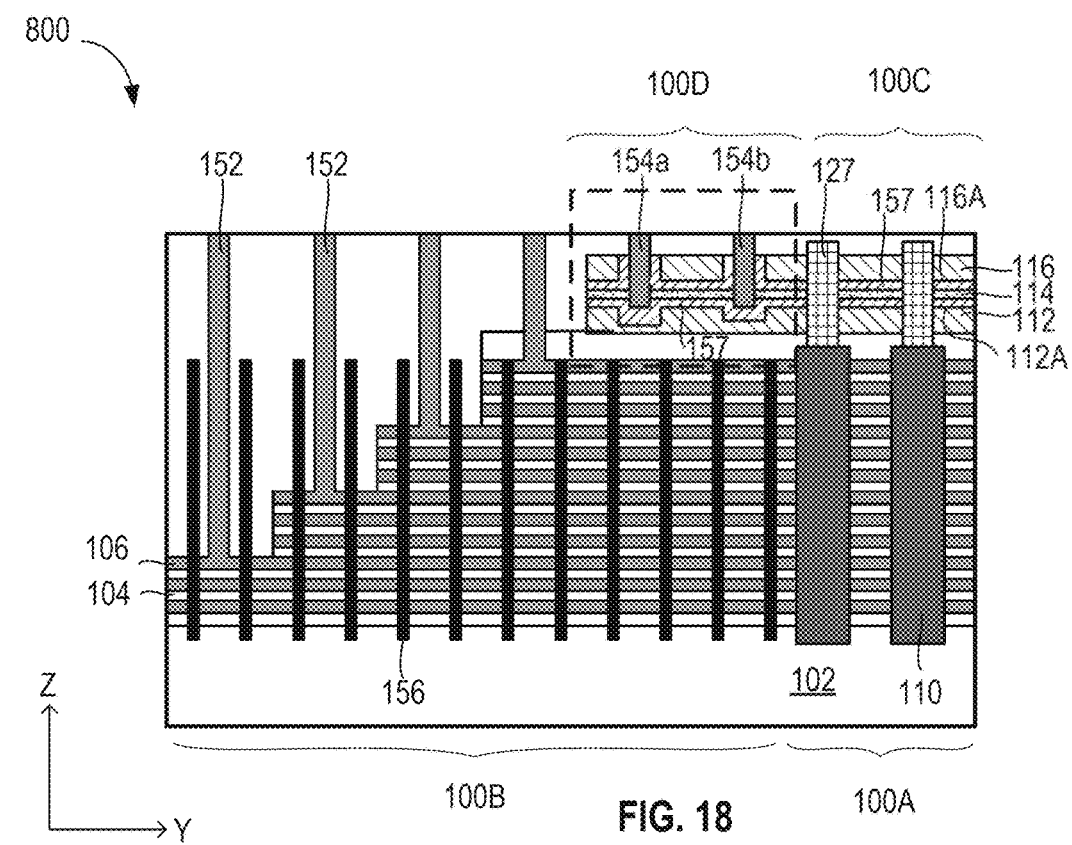
FIG. 18 is a fourth cross-sectional view of the second 3D NAND memory device, in accordance with exemplary embodiments of the disclosure.

In FIGS. 17 and 18, the TSG staircase region 100D can include a single stair S1, and the staircase region 100B of the stack of insulating layers 104 and the word line layers 106 can include stairs S2-S5. A side portion 112B of the first TSG layer 112 and a side portion 116B of the second TSG layer 116 can be aligned at the TSG staircase region 100D. As shown in FIG. 17, the device 800 can include a plurality of TSG contacts (e.g., 154a and 154b) extending from the first TSG layer 112 and further through the conductive layer 157 formed on the top surface 112A of the first TSG layer 112, the first dielectric layer 114, the conductive layer 157 formed on the bottom surface 116A of the second TSG layer 116, and the second TSG layer 116 at the stair S1 of the TSG staircase region 100D.

In another embodiment, as shown in FIG. 18, the conductive layers 157 can be further positioned between a side portion of the TSG contacts (e.g., 154a-154b) and the second TSG layer 116, and a bottom portion of the TSG contacts (e.g., 154a-154b) and the first TSG layer 112.

Figure 19:
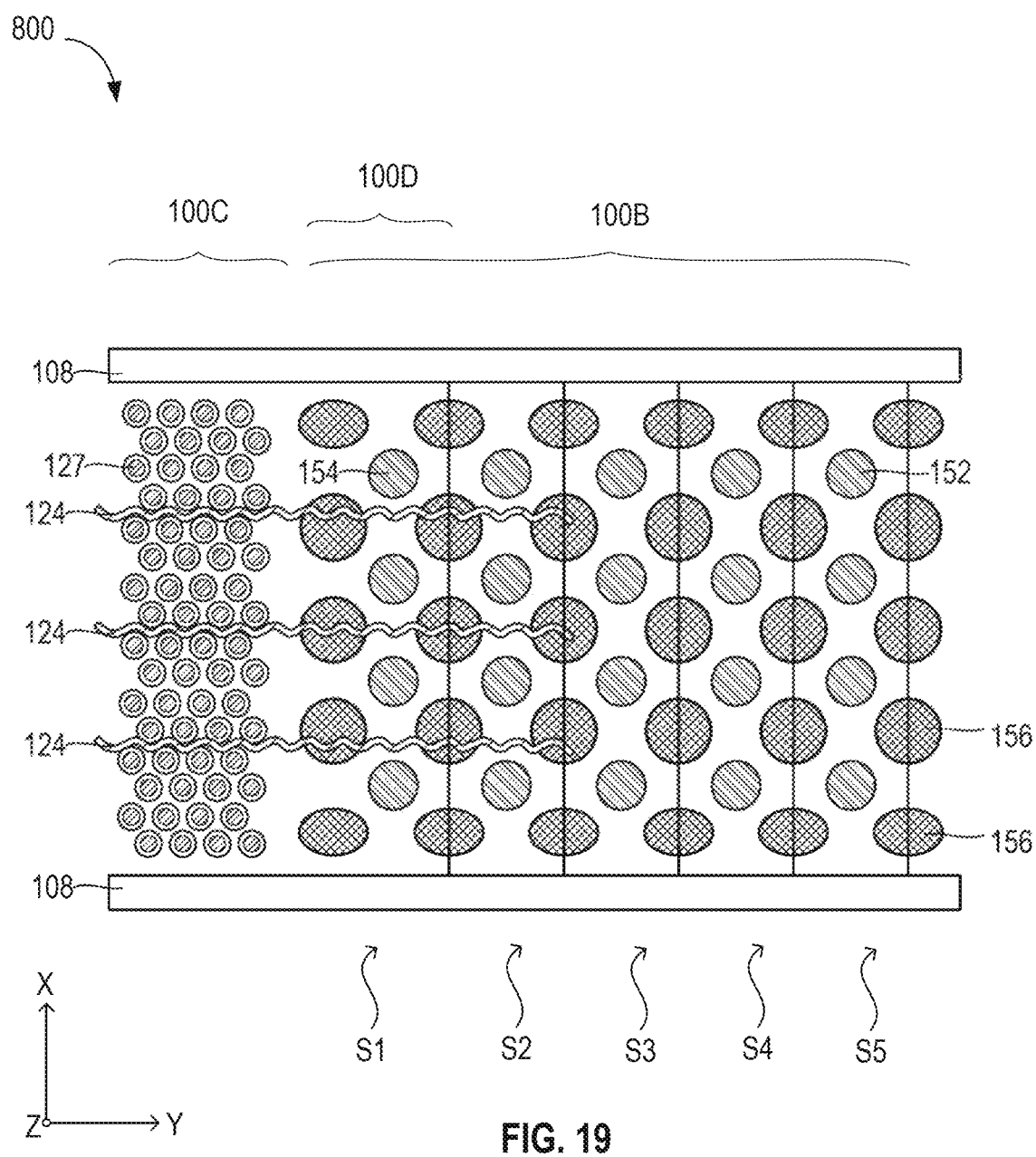
FIG. 19 is a top down view of the second 3D NAND memory device, in accordance with exemplary embodiments of the disclosure.

FIG. 19 is a top down view of the device 800. As shown in FIG. 19, the device 800 can include the TSG array region 100C over the array region 100A (not shown) of the stack and a TSG staircase region 100D over the staircase region 100B of the stack. The TSG staircase region 100D can include the stair S1, and the staircase region 100B of the stack can include stairs S2-S5. The device can include second channel structures 127 positioned in the TSG array region 100C, TSG contacts 154 positioned in the TSG staircase region 100D, word line contacts 152 positioned in the staircase region 100B of the stack, and the dummy channel structures 156. In addition, the slit structures 108 can be formed to extend along the Y direction and further through the TSG array region 100C and the array region 100A of the stack along the Z direction. The separation structures 124 can extend along the Y direction and further through the TSG array region 100C and the array region 100A of the stack along the Z direction to divide the first and second TSG layers into sub TSG layers. In some embodiments, the separation structures 124 can further be positioned over the slit structures 108 and extend along the Y direction.

Figure 20:
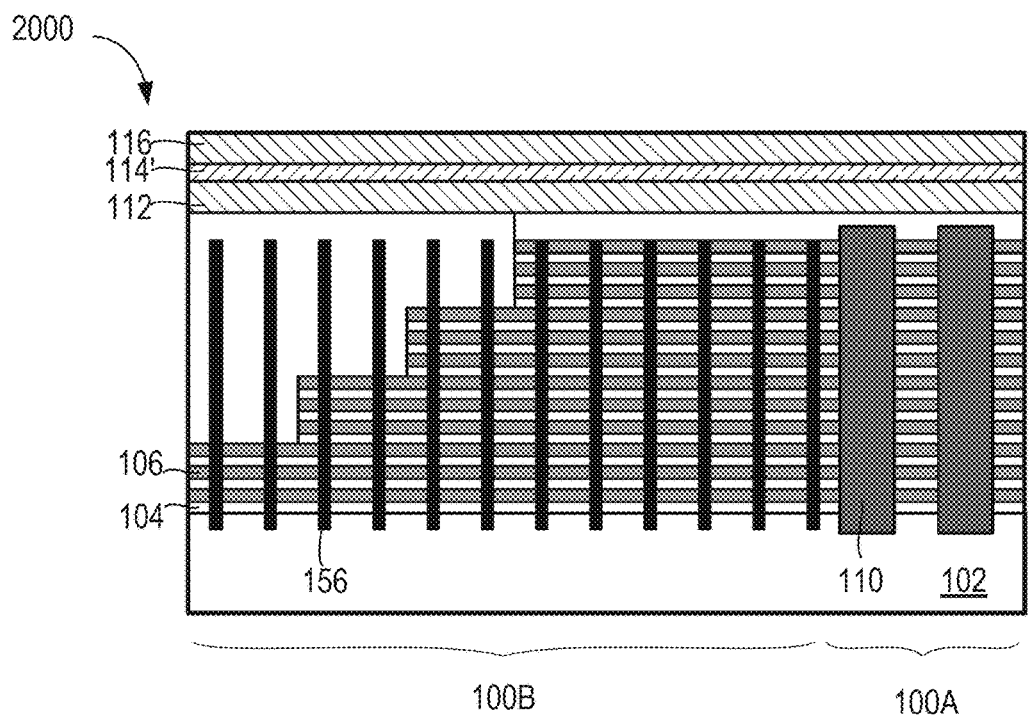
FIGS. 20-26 are cross-sectional views of various intermediate steps of manufacturing the second 3D NAND memory device, in accordance with exemplary embodiments of the disclosure.

FIGS. 20-26 are cross-sectional views of various intermediate steps of manufacturing the device 800, in accordance with exemplary embodiments of the disclosure. As shown in FIG. 20, a semiconductor structure 2000 can be formed. The semiconductor structure 2000 can include a stack of alternating insulating layers 104 and word line layers 106 over the substrate 102, and further include an array region 100A and a staircase region 100B. First channel structures 110 can be formed in the array region 100A of the stack, and staircase region 100B of the stack can include stairs. In addition, dummy channel structures 156 can be formed in the stack. A first TSG layer 112 can be formed over the stack, a sacrificial layer 114' can be formed over the first TSG layer 112, and a second TSG layer 116 can be formed over the sacrificial layer 114'.

Figure 21:
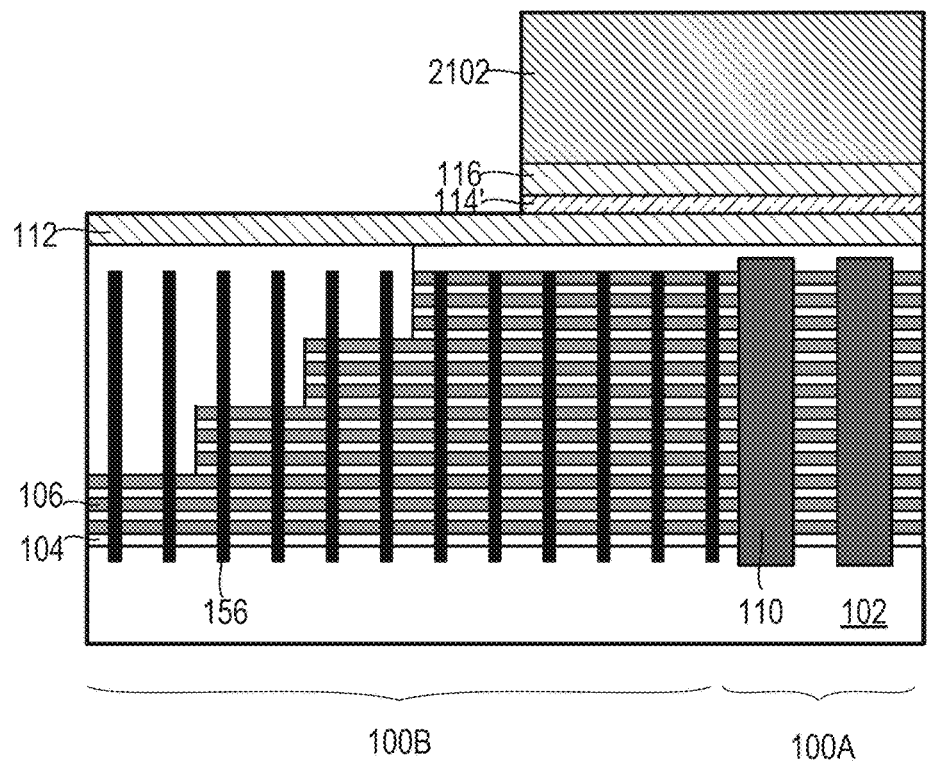

In FIG. 21, a patterned mask layer 2102 can be formed over the second TSG layer 116 by a photolithography process, and an etching process can subsequently be applied to remove portions of the sacrificial layer 114' and the second TSG layer 116 that are positioned over the staircase region 100B of the stack.

Figure 22:
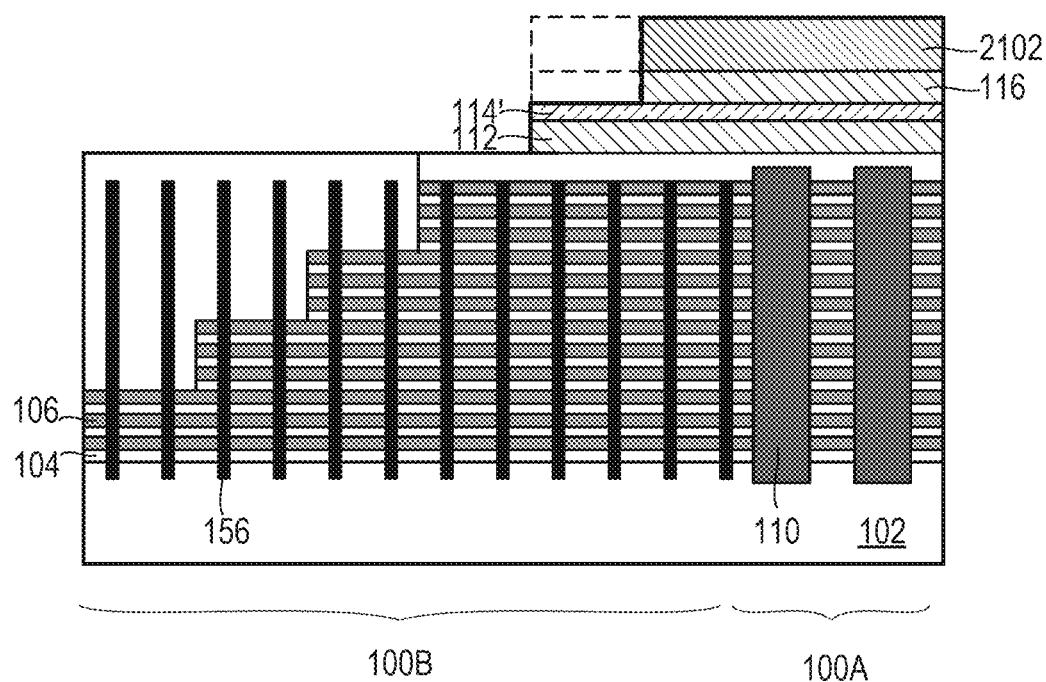

In FIG. 22, the patterned mask layer 2102 can be trimmed such that a portion of the second TSG layer 116 is exposed. A selective etching process can be performed based on the patterned mask layer 2102 to etch the first TSG layer 112 and the second TSG layer 116 that are uncovered, and the sacrificial layer 114' is not affected by the selective etching process. The patterned mask layer 2102 can further be removed by a plasma strip process.

Figure 23:
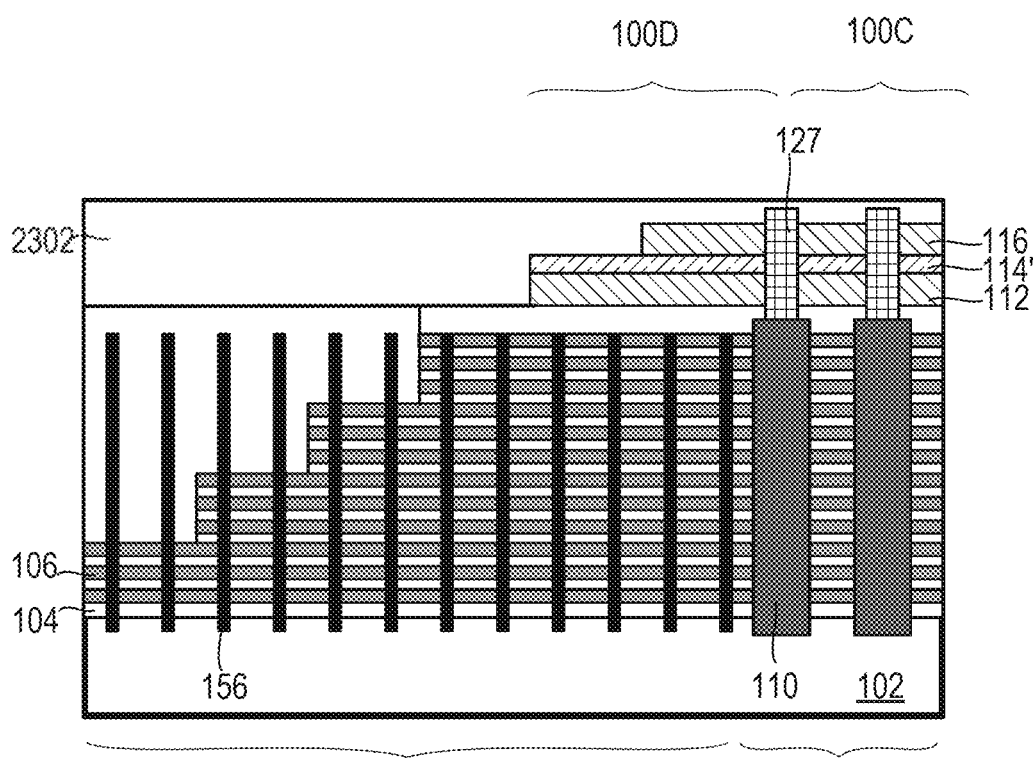

In FIG. 23, a plurality of second channel structures 127 can be formed. The second channel structures 127 can be positioned over and coupled to the first channel structures 110, and extend through the first TSG layer 112, the sacrificial layer 114', and the second TSG layer 116. When the second channel structures 127 are formed, a TSG staircase region 100D and a TSG array region 100C can accordingly be formed. The TSG staircase region 100D can be positioned over the staircase region 100B of the stack, and the TSG array region 100C can be positioned over the array region 100A of the stack. It should be noted that a dielectric layer 2302 can be formed to cover the TSG staircase region 100D and the TSG array region 100C.

Figure 24:
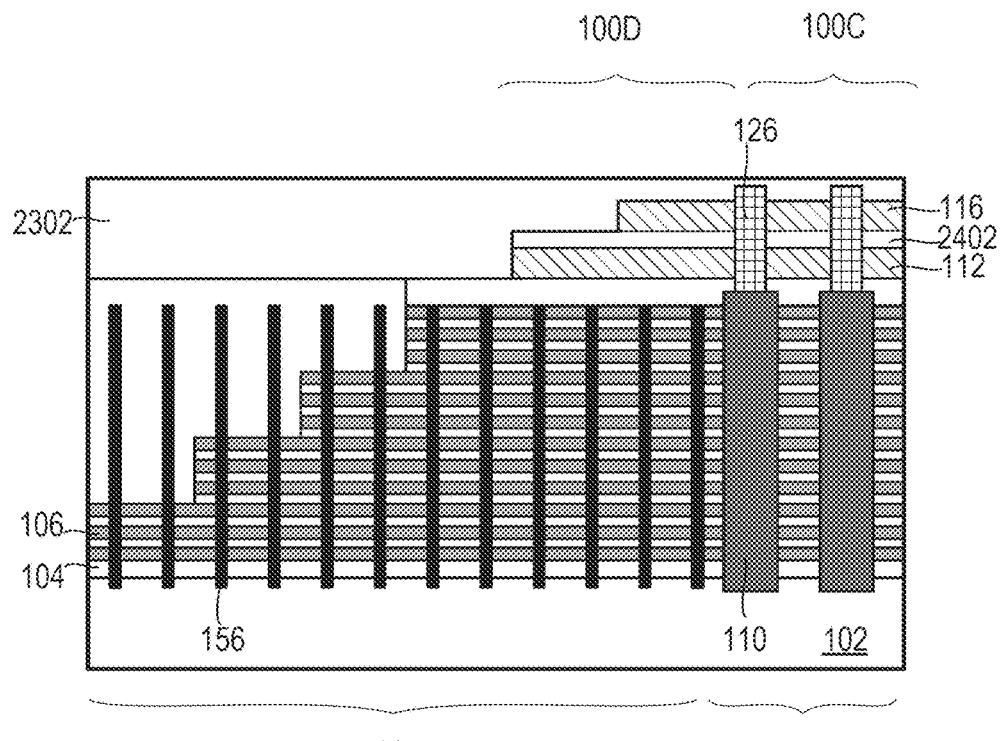

In FIG. 24, the sacrificial layer 114' can be removed by an etching process and spaces 2402 can be formed between the first TSG layer 112 and the second TSG layer 116. The spaces 2402 can be similar to the spaces 1202 in FIG. 12.

Figure 25:
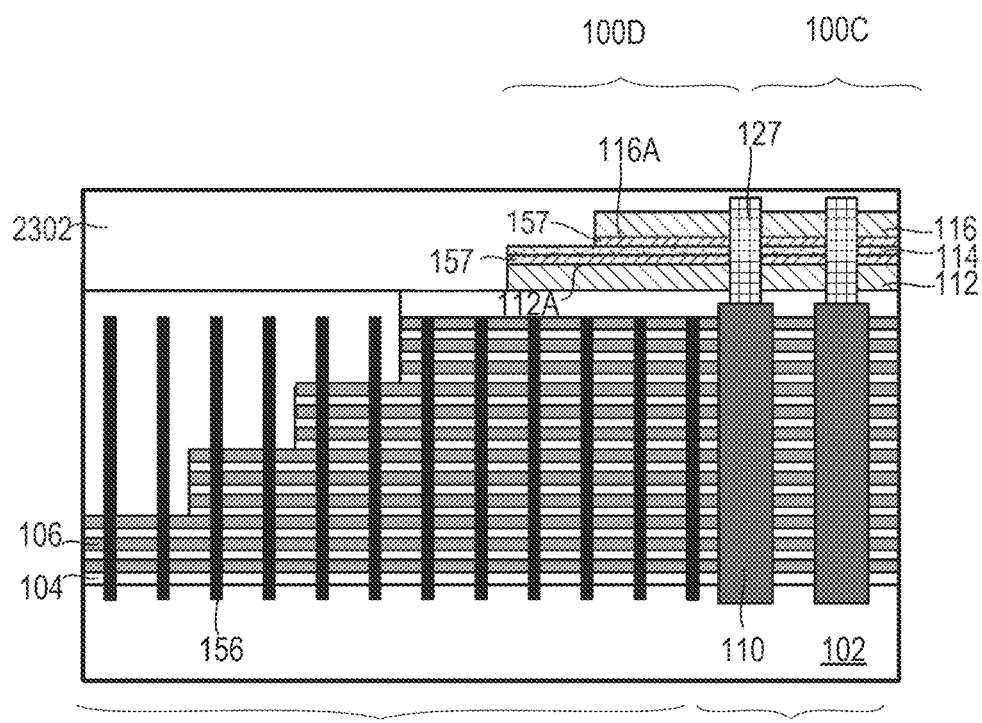

In FIG. 25, conductive layers 157 can be formed in the spaces 2402. As shown in FIG. 25, the conductive layers 157 can be formed over the top surface 112A of the first TSG layer 112, and over the bottom surface 116A of the second TSG layer 116. Further, the first dielectric layer 114 can be formed in the spaces 2402. The first dielectric layer 114 can be positioned between the first and second TSG layers 112 and 116, and in contact with the conductive layers 157.

Figure 26:
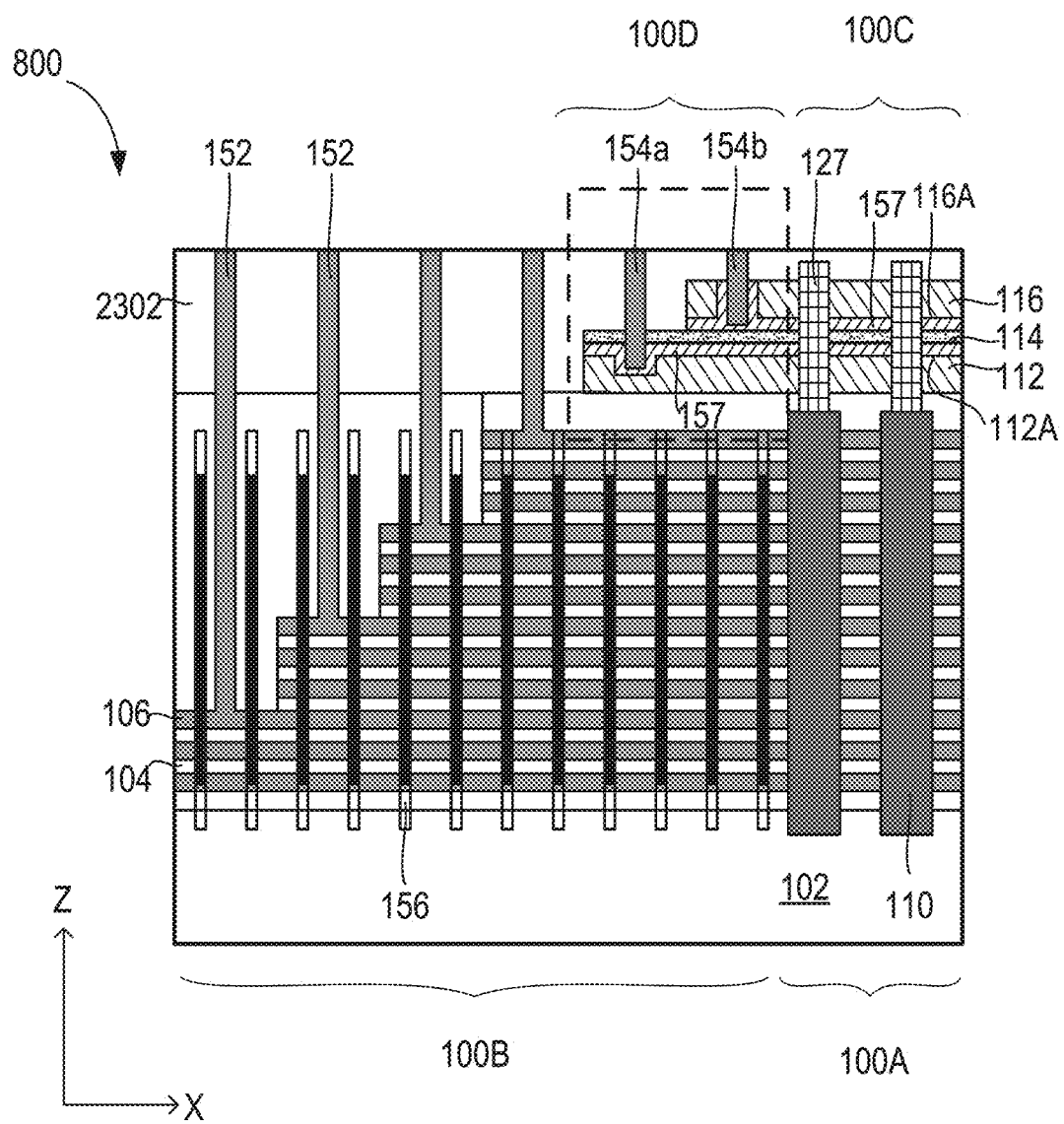

In FIG. 26, a plurality of word line contacts 152 can be formed in the staircase region 100B of the stack and a plurality of TSG contacts 154a-154b can be formed in the TSG staircase region 100D. As shown in FIG. 26, the word line contacts 152 can extend from the word line layers 106, and the TSG contacts 154a-154b can extend from the first TSG layer 112 and the second TSG layer 116 respectively. In addition, the conductive layers 157 can further be positioned between a side portion of the TSG contact 154b and the second TSG layer 116, and between a bottom portion of the TSG contact 154a and the first TSG layer 112. Upon the formation of the TSG contacts 154a-154b and the word line contacts 152, a 3D NAND memory device 800 can be formed that can be similar to the device 800 in FIG. 16.

Figure 27:
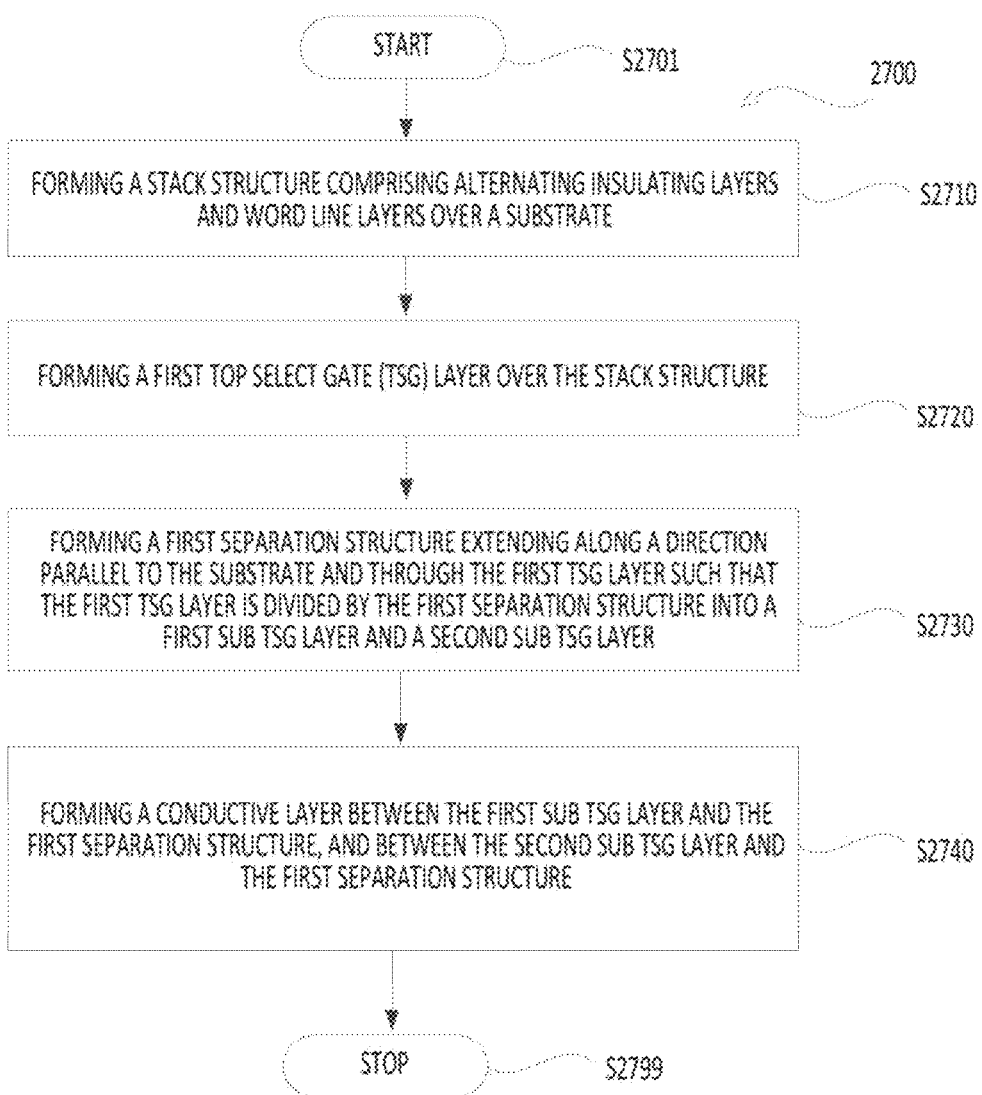
FIG. 27 is a flowchart of a process for manufacturing a 3D NAND memory device, in accordance with exemplary embodiments of the disclosure.

FIG. 27 is a flowchart of an exemplary process 2700 for fabricating a 3D NAND memory device. The process 2700 begins at S2701, and then proceeds to S2710. At S2710, a stack structure can be formed to include alternating insulating layers and word line layers over a substrate. At S2720, a first top select gate (TSG) layer can be formed over the stack structure. In some embodiments, S2710 and S2720 can be performed as illustrated with reference to FIG. 2.

At S2730, a first separation structure can be formed to extend along a direction parallel to the substrate and through the first TSG layer such that the first TSG layer can be divided by the first separation structure into a first sub TSG layer and a second sub TSG layer. In some embodiments, S2730 can be performed as illustrated with reference to FIGS. 3 and S.

At S2740, a conductive layer can be formed between the first sub TSG layer and the first separation structure, and between the second sub TSG layer and the first separation structure. In some embodiments, S2740 can be performed as illustrated with reference to FIG. 4.

In the process 2700, as shown in FIG. 2, a first channel structure can be formed to extend through the insulating layers and the word line layers and into the substrate. As shown in FIG. 6, a second channel structure can be arranged over and coupled to the first channel structure. The second channel structure can further extend through the first TSG layer.

In order to form the channel structure, as shown in FIG. 1B, a channel opening (not shown) can be formed to extend through the insulating layers and the word line layers and further into the substrate. A blocking layer can be formed in the channel opening, a charge storage layer can be formed over the blocking layer, a tunneling layer can be formed over the charge storage layer, a channel layer can be formed over the tunneling layer, an isolation layer can be formed over the channel layer, and forming a top channel contact over the isolation layer and in contact with the channel layer.

In order to form the second channel structure, as shown in FIG. 1B, a gate dielectric layer can be formed to extend through the first TSG layer and into the top channel contact of the first channel structure. A second channel layer can be formed along the gate dielectric layer, where the second channel layer can be disposed over and in contact with the top channel contact of the first channel structure. A second isolation layer can be formed over the second channel layer, and a second channel contact can be formed over the second isolation layer and in contact with the second channel layer.

In the process 2700, as shown in FIGS. 6 and 7, a first dielectric layer can be formed over the first TSG layer, a second dielectric layer can be formed over the first dielectric layer, and a contact can be formed over the second channel structure and to extend through the second dielectric layer.

In some embodiments, a second TSG layer can be formed between the stack structure and the first TSG layer, and an interface layer can be formed between the first TSG layer and the second TSG layer.

In some embodiments, the first separation structure can further extend through the second TSG layer and the interface layer to divide the second TSG layer into a third sub TSG layer and a fourth sub TSG layer. Accordingly, the conductive layer can further be positioned between the second TSG layer and the interface layer, between the interface layer and the first TSG layer, between the third sub TSG layer and the first separation structure, and between the fourth sub TSG layer and the first separation structure.

In the process 2700, a slit structure can be formed to extend through the word line layers and the insulating layers and further extend along a direction parallel to the substrate. A second separation structure can be formed to extend along the direction parallel to the substrate, extend through the first and second TSG layers, and be positioned over the slit structure.

It should be noted that additional steps can be provided before, during, and after the process 2700, and some of the steps described can be replaced, eliminated, or performed in different order for additional embodiments of the process 2700. In subsequent process steps, various additional interconnect structures (e.g., metallization layers having conductive lines and/or VIAs) may be formed over the 3D NAND memory device (e.g., 100). Such interconnect structures electrically connect the 3D NAND memory device with other contact structures and/or active devices to form functional circuits. Additional device features such as passivation layers, input/output structures, and the like may also be formed.

Figure 28:
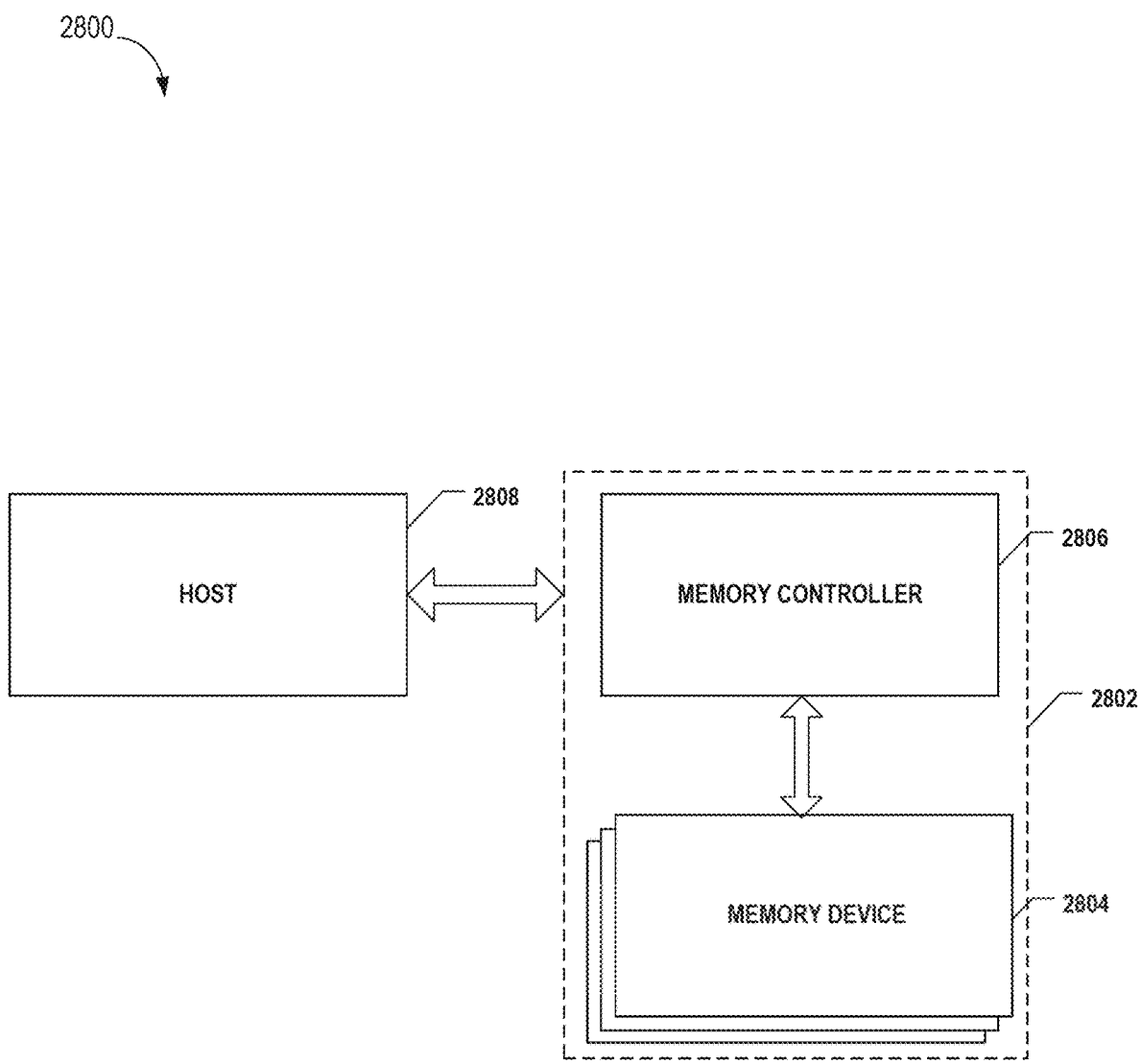
FIG. 28 illustrates a block diagram of an exemplary system having a memory device, according to some aspects of the present disclosure.

FIG. 28 shows a block diagram of an exemplary system 2800 having a memory device, according to some aspects of the present disclosure. The system 2800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 28, the system 2800 can include a host 2808 and a memory system 2802 having one or more memory devices 2804 and a memory controller 2806. The host 2808 can be a processor of an electronic device, such as a central processing unit (CPU), or a system-on-chip (SoC), such as an application processor (AP). The host 2808 can be configured to send or receive data to or from the one or more memory devices 2804.

The one or more memory devices 2804 can be any memory device disclosed in the present disclosure, such as the device 100 shown in FIG. 1A or the device 800 shown in FIG. 8. The device 100 can include a stack structure that includes alternating insulating layers and word line layers, a first TSG layer over the stack structure, and a first separation structure extending through the first TSG layer, where the first TSG layer can be divided by the first separation structure into a first sub TSG layer and a second sub TSG layer. The device 100 can include a conductive layer positioned between the first sub TSG layer and the first separation structure, and between the second sub TSG layer and the first separation structure. The device 800 can further include a second TSG layer positioned between the stack structure and the first TSG layer, and an interface layer positioned between the first TSG layer and the second TSG layer. Accordingly, the first separation structure can further extend through the second TSG layer and the interface layer to divide the second TSG layer into a third sub TSG layer and a fourth sub TSG layer, and the conductive layer can further be positioned between the second TSG layer and the interface layer, between the interface layer and the first TSG layer, between the third sub TSG layer and the first separation structure, and between the fourth sub TSG layer and the first separation structure.

The memory controller 2806 is coupled to the one or more memory devices 2804 and the host 2808 and is configured to control the one or more memory devices 2804, according to some implementations. The memory controller 2806 can manage the data stored in the one or more memory devices 2804 and communicate with the host 2808. In some implementations, the memory controller 2806 is designed for operating in a low duty-cycle environment like secure digital (SD) cards, compact flash (CF) cards, universal serial bus (USB) Flash drives, or other media for use in electronic devices, such as personal computers, digital cameras, mobile phones, etc. In some implementations, the memory controller 2806 is designed for operating in a high duty-cycle environment SSDs or embedded multi-media-cards (eMMCs) used as data storage for mobile devices, such as smartphones, tablets, laptop computers, etc., and enterprise storage arrays. The memory controller 2806 can be configured to control operations of the one or more memory devices 2804, such as read, erase, and program operations. As mentioned above, the one or more memory devices 2804 can be the device 100 shown in FIG. 1A or the device 800 in FIG. 8. Accordingly, the memory controller 2806 is configured to control operation of the device 100 or the device 800, such as read, erase, and program operations.

The memory controller 2806 can also be configured to manage various functions with respect to the data stored or to be stored in the one or more memory devices 2804 including, but not limited to bad-block management, garbage collection, logical-to-physical address conversion, wear leveling, etc. In some implementations, the memory controller 2806 is further configured to process error correction codes (ECCs) with respect to the data read from or written to the one or more memory devices 2804. Any other suitable functions may be performed by the memory controller 2806 as well, for example, formatting the one or more memory devices 2804. The memory controller 2806 can communicate with an external device (e.g., the host 2808) according to a particular communication protocol. For example, the memory controller 2806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a firewire protocol, etc.

Figure 29:
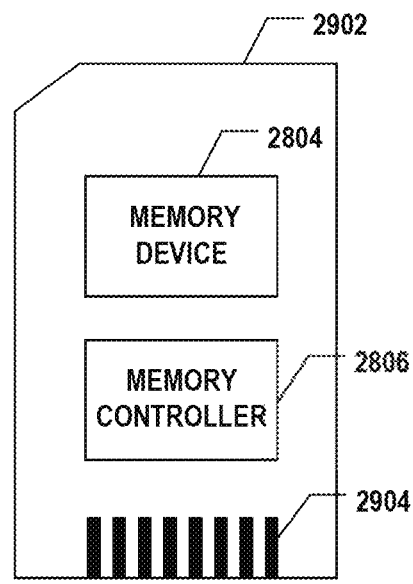
FIG. 29 illustrates a diagram of an exemplary memory card having a memory device, according to some aspects of the present disclosure.
Figure 30:
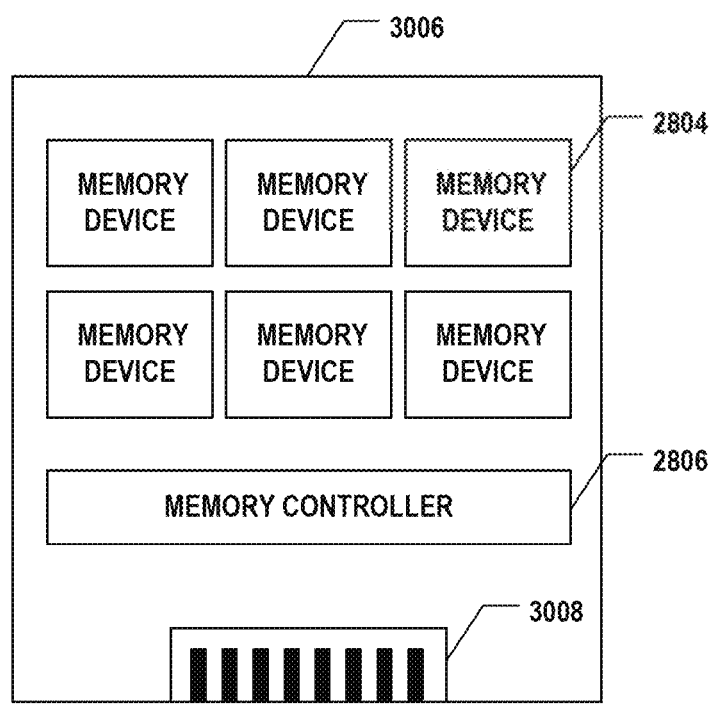
FIG. 30 illustrates a diagram of an exemplary solid-state drive (SSD) having a memory device, according to some aspects of the present disclosure.

The memory controller 2806 and the one or more memory devices 2804 can be integrated into various types of storage devices, for example, be included in the same package, such as a universal flash storage (UFS) package or an eMMC package. That is, the memory system 2802 can be implemented and packaged into different types of end electronic products. In one example as shown in FIG. 29, the memory controller 2806 and a single memory device 2804 may be integrated into a memory card 2902. The memory card 2902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 2902 can further include a memory card connector 2904 configured to couple memory card 2902 to a host (e.g., the host 2808 in FIG. 28). In another example as shown in FIG. 30, the memory controller 2806 and multiple memory devices 2804 may be integrated into an SSD 3006. The SSD 3006 can further include an SSD connector 3008 configured to couple SSD 3006 to a host (e.g., the host 2808 in FIG. 28). In some implementations, the storage capacity and/or the operation speed of the SSD 3006 is greater than those of the memory card 2902.

The various embodiments described herein offer several advantages over related examples. In the disclosure, a 3D NAND device can include a stack of alternating insulating layers and word line layers over a substrate, and a stack of TSG layers over the stack of the insulating layers and the word line layers. The stack of TSG layers can include one or more TSG layers and one or more dielectric layers that are positioned alternatingly, where the one or more TSG layers and the word line layers can include different materials. A plurality of second channel structure can be formed to extend through the stack of TSG layers to form a plurality of TSTs. A plurality of TSG cut structures can be formed to separate the TSG layers into sub TSG layers. Further, conductive layers, such as silicide layers, can be formed along sidewalls, top surface, or bottom surfaces of the sub TSG layers to form high conductivity channels for voltage transmission, which can effectively reduce the voltage drop and signal delay of the one or more TSG layers. In addition, contact structures at the staircase region of the 3D NAND memory device can also be connected to the conductive layers to reduce the contact potential between the contact structures and the one or more TSG layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack structure comprising alternating insulating layers and word line layers;
   a first top select gate (TSG) layer over the stack structure;
   a separation structure extending through the first TSG layer, the first TSG layer is divided by the separation structure into a first sub TSG layer and a second sub TSG layer; and
   a conductive layer positioned between the first sub TSG layer and the separation structure, and between the second sub TSG layer and the separation structure,
   wherein:
   the word line layers comprise a first material, and the first TSG layer comprises a second material that is different from the first material.

2. The semiconductor device according to claim 1, further comprising:
   a first channel structure extending through the stack structure; and
   a second channel structure extending through the first TSG layer, the second channel structure being positioned over and coupled to the first channel structure.

3. The semiconductor device according to claim 2, wherein the first channel structure further comprises:
   a block layer extending through the insulating layers and the word line layers and further into a substrate on which the stack structure is positioned
   a charge storage layer formed over the blocking layer;
   a tunneling layer formed over the charge storage layer;
   a channel layer formed over the tunneling layer;
   an isolation layer formed over the channel layer; and
   a top channel contact formed over the isolation layer and in contact with channel layer.

4. The semiconductor device according to claim 3, wherein the second channel structure further comprises:
   a gate dielectric layer extending through the first TSG layer and into the top channel contact of the first channel structure; and
   a second channel layer formed along the gate dielectric layer, the second channel layer being disposed over and in contact with the top channel contact of the first channel structure.

5. The semiconductor device according to claim 1, wherein the conductive layer comprises a metallic silicide.

6. The semiconductor device according to claim 1, further comprising:

a second TSG layer positioned between the stack structure and the first TSG layer; and
   an interface layer positioned between the first TSG layer and the second TSG layer.

7. The semiconductor device according to claim 6, wherein:
   the separation structure further extends through the second TSG layer and the interface layer to divide the second TSG layer into a third sub TSG layer and a fourth sub TSG layer, and
   the conductive layer is further positioned between the second TSG layer and the interface layer, between the interface layer and the first TSG layer, between the third sub TSG layer and the separation structure, and between the fourth sub TSG layer and the separation structure.

8. The semiconductor device according to claim 7, further comprising:
   a slit structure extending through the word line layers and the insulating layers and further extending along a direction parallel to the substrate,
   the separation structure extending along the direction parallel to the substrate, extending through the first and second TSG layers, and positioned over the slit structure.

9. The semiconductor device according to claim 8, further comprising:
   an array region and a staircase region adjacent to the array region, wherein:
   the first channel structure and the second channel structure are positioned in the array region, and
   the staircase region comprises a plurality of stairs.

10. The semiconductor device according to claim 9, wherein the plurality of stairs comprises a first stair formed in the first and second TSG layers, the semiconductor device further comprising:
    a TSG contact formed at the first stair of the plurality of stairs, the TSG contact extending from the second TSG layer, the conducive layer positioned (i) between the second TSG layer and the interface layer and (ii) between the interface layer and the first TSG layer.

11. The semiconductor device according to claim 10, wherein:
    the conductive layer further extends through the first TSG layer, and extend into the second TSG layer, the TSG contact is in contact with the conductive layer.

12. The semiconductor device according to claim 9, wherein the plurality of stairs comprises a first stair formed in the first TSG layer and a second stair formed in the second TSG layer, the semiconductor device further comprising:
    a first TSG contact extending through the first TSG layer and into the conductive layer at the first stair of the plurality of stairs; and
    a second TSG contact extending through the interface layer and the conductive layer at the second stair of the plurality of stairs.

13. The semiconductor device according to claim 12, wherein:
    the conductive layer is further extend through the first TSG layer, the first TSG contact is surrounded by the conductive layer at the first stair of the plurality of stairs, and extend into the second TSG layer, the second TSG contact is in contact with the conductive layer at the second stair of the plurality of stairs.

14. A method of manufacturing a semiconductor device, comprising:

forming a stack structure comprising alternating insulating layers and word line layers;
forming a first top select gate (TSG) layer over the stack structure;
forming a separation structure extending through the first TSG layer such that the first TSG layer is divided by the separation structure into a first sub TSG layer and a second sub TSG layer; and
forming a conductive layer between the first sub TSG layer and the separation structure, and between the second sub TSG layer and the separation structure,
wherein:
the word line layers comprise a first material, and the first TSG layer comprises a second material that is different from the first material.

15. The method according to claim 14, further comprising:
forming a first channel structure extending through the insulating layers and the word line layers; and
forming a second channel structure positioned over and coupled to the first channel structure, the second channel structure further extending through the first TSG layer.

16. The method according to claim 15, wherein the forming the first channel structure further comprises:
forming a channel opening extending through the insulating layers and the word line layers;
forming a blocking layer in the channel opening;
forming a charge storage layer over the blocking layer;
forming a tunneling layer over the charge storage layer;
forming a channel layer over the tunneling layer;
forming an isolation layer over the channel layer; and
forming a top channel contact over the isolation layer and in contact with the channel layer.

17. The method according to claim 16, wherein forming the second channel structure further comprises:
forming a gate dielectric layer extending through the first TSG layer and into the top channel contact of the first channel structure;
forming a second channel layer along the gate dielectric layer, the second channel layer being disposed over and in contact with the top channel contact of the first channel structure;
forming a second isolation layer over the second channel layer; and
forming a second channel contact over the second isolation layer and in contact with the second channel layer.

18. The method according to claim 17, furthering comprising:
forming a first dielectric layer over the first TSG layer;
forming a second dielectric layer over the first dielectric layer; and
forming a contact positioned over the second channel structure and extending through the second dielectric layer.

19. The method according to claim 18, further comprising:
forming a second TSG layer between the stack structure and the first TSG layer; and
forming an interface layer positioned between the first TSG layer and the second TSG layer.

20. A method of manufacturing a semiconductor device, comprising:
forming a stack structure comprising alternating insulating layers and word line layers;
forming a first top select gate (TSG) layer over the stack structure;
forming a separation structure extending through the first TSG layer such that the first TSG layer is divided by the separation structure into a first sub TSG layer and a second sub TSG layer;
forming a conductive layer between the first sub TSG layer and the separation structure, and between the second sub TSG layer and the separation structure;
forming a first channel structure extending through the insulating layers and the word line layers; and
forming a second channel structure positioned over and coupled to the first channel structure, the second channel structure further extending through the first TSG layer,
wherein:
the forming the first channel structure further comprises:
forming a channel opening extending through the insulating layers and the word line layers;
forming a blocking layer in the channel opening;
forming a charge storage layer over the blocking layer;
forming a tunneling layer over the charge storage layer;
forming a channel layer over the tunneling layer;
forming an isolation layer over the channel layer; and
forming a top channel contact over the isolation layer and in contact with the channel layer, and
the forming the second channel structure further comprises:
forming a gate dielectric layer extending through the first TSG layer and into the top channel contact of the first channel structure;
forming a second channel layer along the gate dielectric layer, the second channel layer being disposed over and in contact with the top channel contact of the first channel structure;
forming a second isolation layer over the second channel layer; and
forming a second channel contact over the second isolation layer and in contact with the second channel layer.

* * * * *